(12) United States Patent
Mehrotra

(10) Patent No.: US 8,435,848 B2
(45) Date of Patent: May 7, 2013

(54) PMOS SIGE-LAST INTEGRATION PROCESS

(75) Inventor: Manoj Mehrotra, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/283,817

(22) Filed: Oct. 28, 2011

(65) Prior Publication Data

US 2012/0108021 A1     May 3, 2012

Related U.S. Application Data

(60) Provisional application No. 61/407,801, filed on Oct. 28, 2010.

(51) Int. Cl.
*H01L 21/8238* (2006.01)
(52) U.S. Cl.
USPC ............. 438/199; 438/300; 257/E21.632; 257/E21.619; 257/E21.639

(58) Field of Classification Search ............... 438/197, 438/199, 300, 301, 303, 581; 257/E21.632, 257/E21.619, E21.639
See application file for complete search history.

(56) References Cited

U.S. PATENT DOCUMENTS

2012/0012938 A1* 1/2012 Chen et al. .............. 257/369

* cited by examiner

*Primary Examiner* — Thanhha Pham
(74) *Attorney, Agent, or Firm* — Wade J. Brady, III; Frederick J. Telecky, Jr.

(57) ABSTRACT

A process of forming a CMOS integrated circuit including integrating SiGe source/drains in the PMOS transistor after source/drain and LDD implants and anneals. A dual layer hard mask is formed on a polysilicon gate layer. The bottom layer prevents SiGe growth on the polysilicon gate. The top layer protects the bottom layer during source/drain spacer removal. A stress memorization layer may be formed on the integrated circuit prior to a source/drain anneal and removed prior to forming a SiGe blocking layer over the NMOS. SiGe spacers may be formed on the PMOS gate to laterally offset the SiGe recesses.

19 Claims, 22 Drawing Sheets

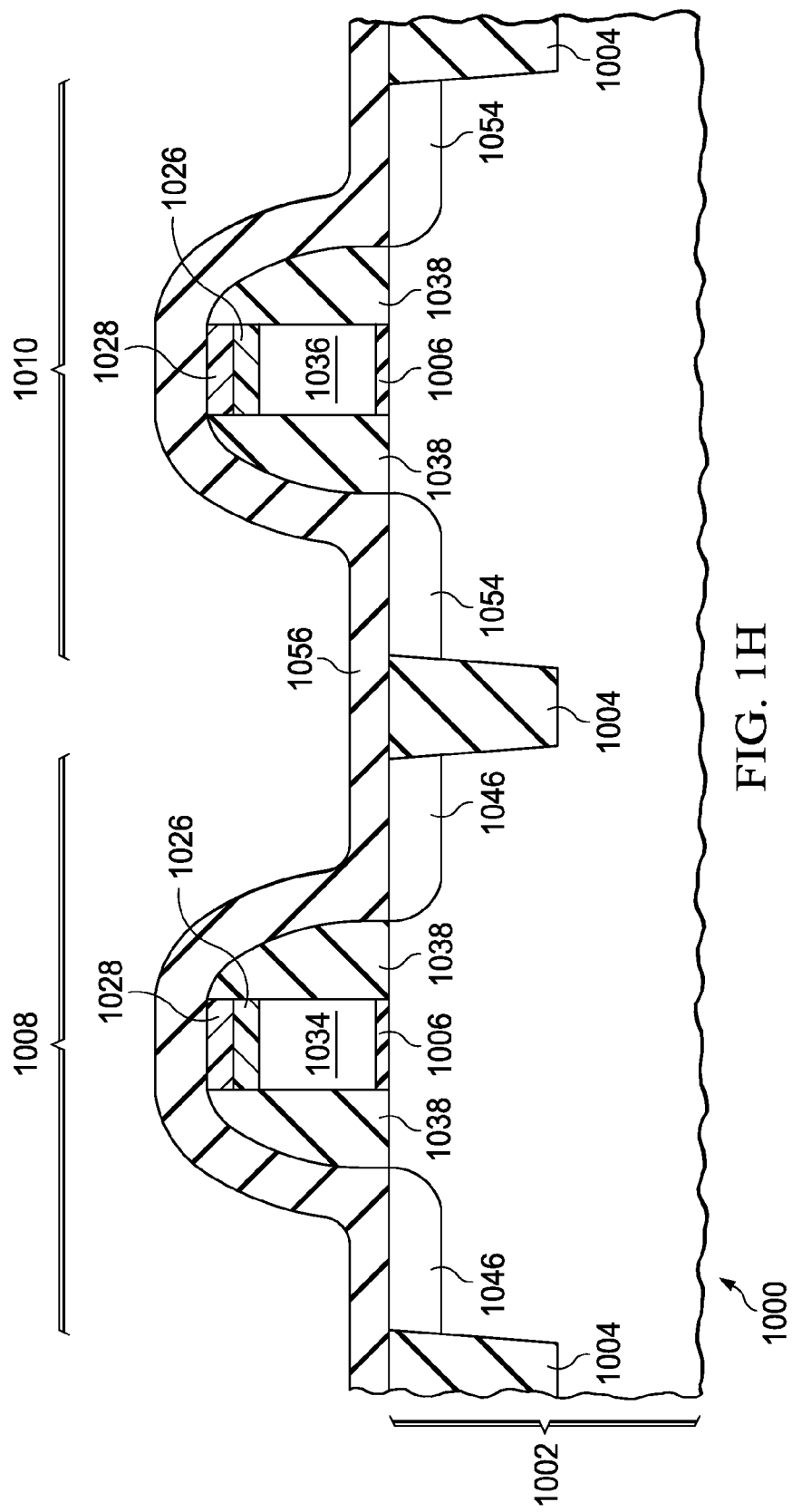

PMOS SIGE-LAST INTEGRATION PROCESS

This application claims the benefit of U.S. Provisional Application No. 61/407,801, filed Oct. 28, 2010, the entirety of which is herein incorporated by reference.

FIELD OF THE INVENTION

This invention relates to the field of integrated circuits. More particularly, this invention relates to complementary metal oxide semiconductor (CMOS) integrated circuits.

BACKGROUND OF THE INVENTION

P-channel metal oxide semiconductor (PMOS) transistors may benefit from compressive stress in channel regions. Silicon-germanium (SiGe) epitaxial material may be grown in source/drain regions of PMOS transistors to add compressive stress. Formation of PMOS transistors in complementary metal oxide semiconductor (CMOS) integrated circuits involves source/drain ion implant operations and thermal anneal operations. Forming SiGe PMOS source/drain (PSD) regions prior to the thermal anneals may result in undesirable reduced stress in the PMOS channel regions due to relaxation of the SiGe stress during the anneals. Forming SiGe PSD regions after the implants and anneals can result in deactivation of the implanted dopants.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A complementary metal oxide semiconductor (CMOS) integrated circuit may be formed by performing a blanket ion implant and a patterned ion implant into a polycrystalline silicon (polysilicon) gate layer to dope gate regions for an n-channel metal oxide semiconductor (NMOS) transistor and a PMOS transistor. A dual layer hard mask may be formed on the polysilicon gate layer prior to formation of lightly doped drain (LDD) regions and source/drain regions in the NMOS transistor and the PMOS transistor. A top hard mask layer of the dual layer hard mask may be removed after source/drain formation, leaving a bottom hard mask layer of the dual layer hard mask in place during subsequent SiGe epitaxial growth in PSD regions. The bottom hard mask layer blocks SiGe growth on the polysilicon PMOS gate. A stress memorization technique (SMT) operation sequence may be included into the formation process sequence for the CMOS integrated circuit.

DETAILED DESCRIPTION

Figure 1A:
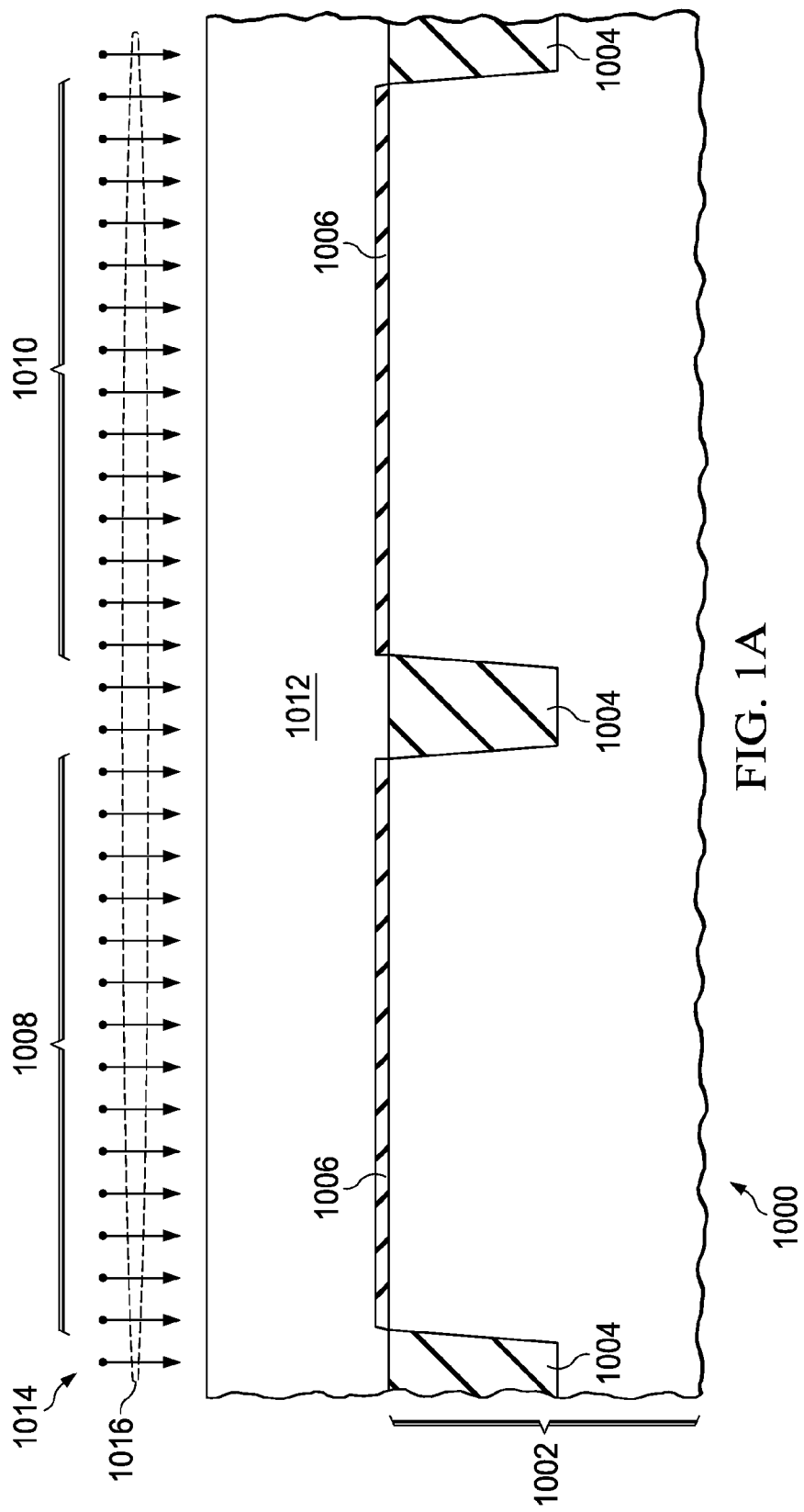
FIG. 1A through FIG. 1V are cross-sections of a CMOS integrated circuits formed according to an embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A complementary metal oxide semiconductor (CMOS) integrated circuit may include a p-channel metal oxide semiconductor (PMOS) transistor with silicon-germanium (SiGe) source/drain regions which are formed after anneals of lightly doped drain (LDD) and source/drain ion implants. Forming the SiGe PMOS source/drain (PSD) regions after the LDD and source/drain anneals may advantageously provide a higher level of stress in a PMOS channel region than other CMOS integration schemes. SiGe is blocked from growing on polycrystalline silicon, commonly referred to as polysilicon, in a gate of the PMOS transistor by forming a dual layer hard mask on a polysilicon gate layer prior to defining the PMOS gate by etching. N-channel metal oxide semiconductor (NMOS) and PMOS gate regions of the polysilicon gate layer are doped by a blanket ion implant operation coupled with a patterned ion implant operation. A stress memorization layer may be formed on the NMOS and PMOS gates prior to a source/drain anneal and removed subsequent to the source/drain anneal.

Figure 1B:
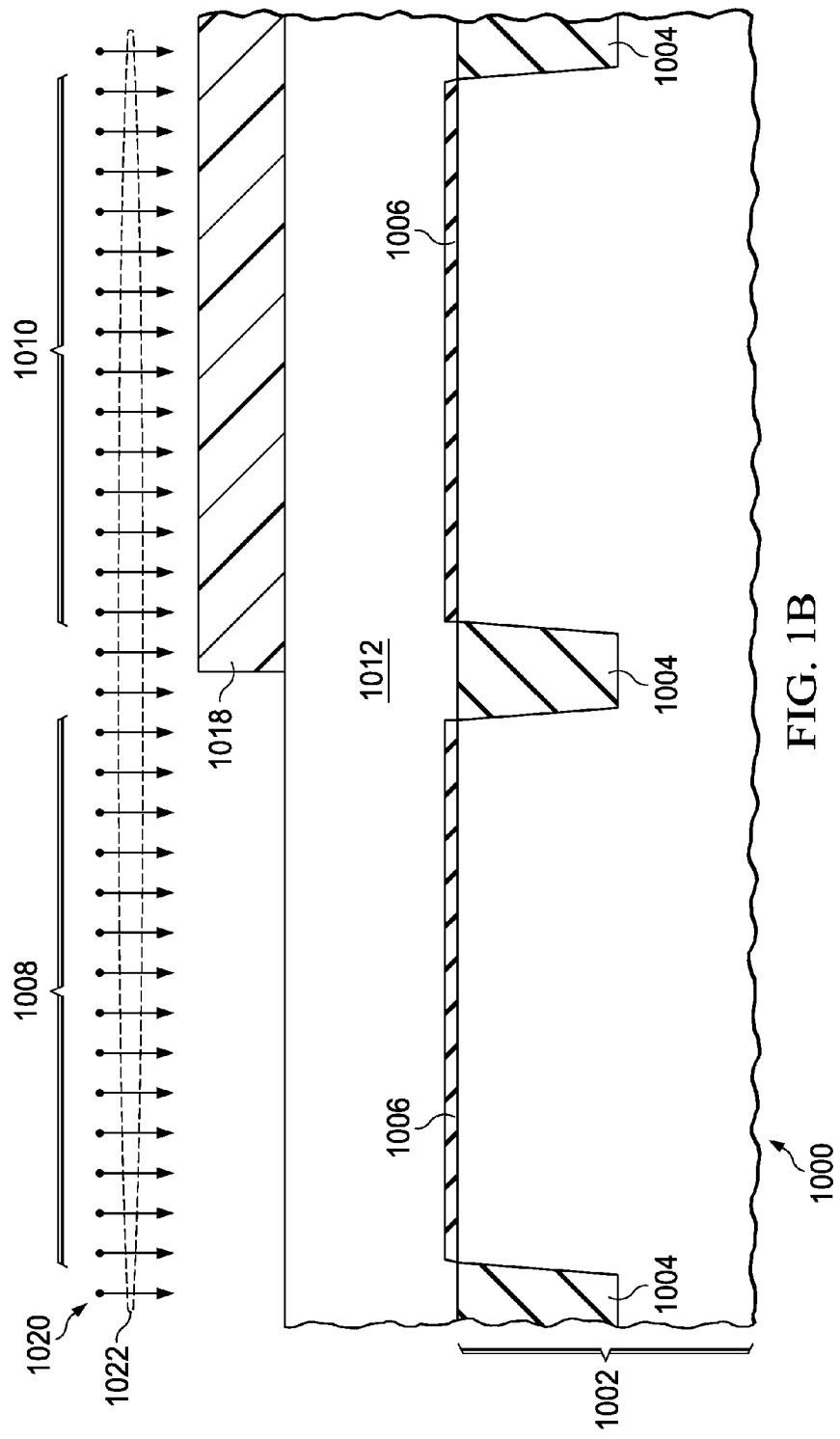
Figure 1C:
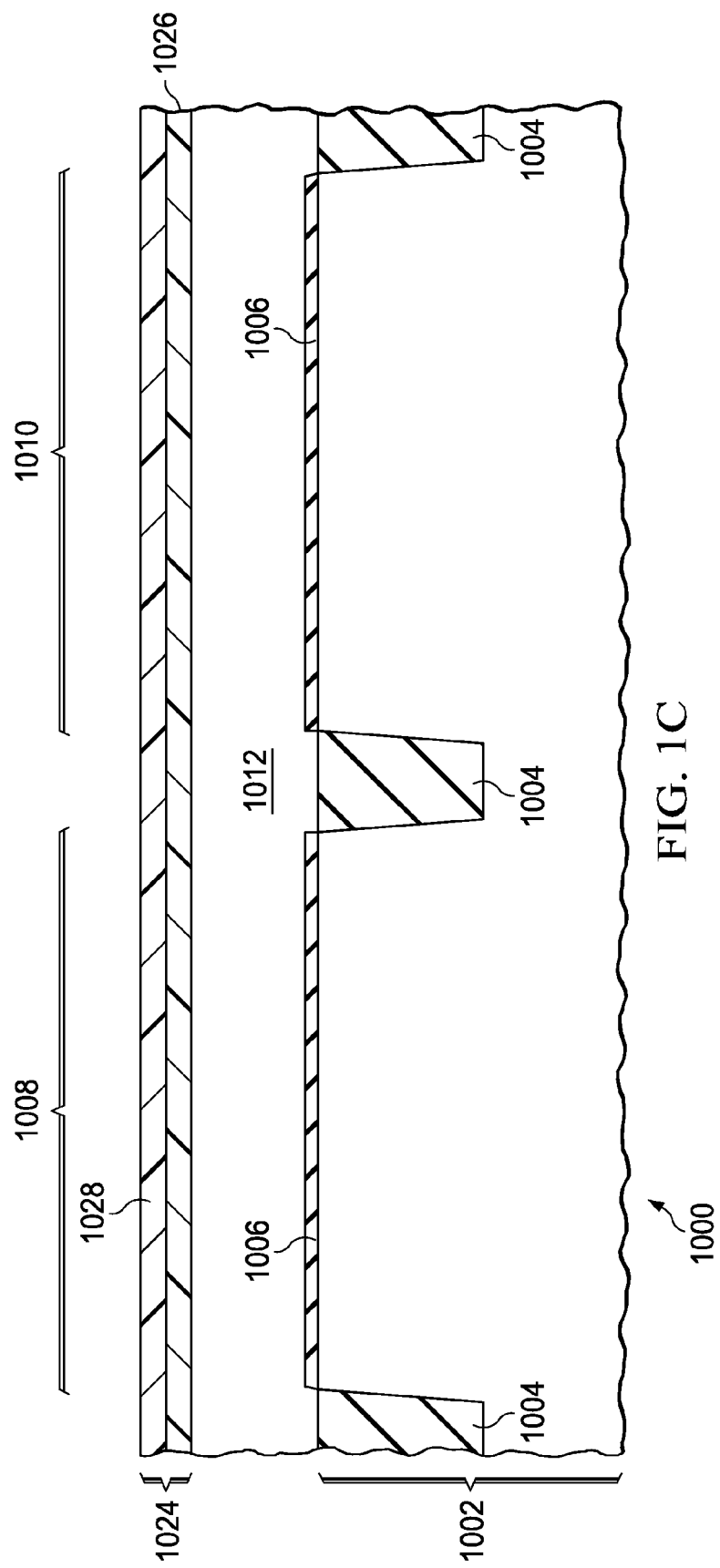
Figure 1D:
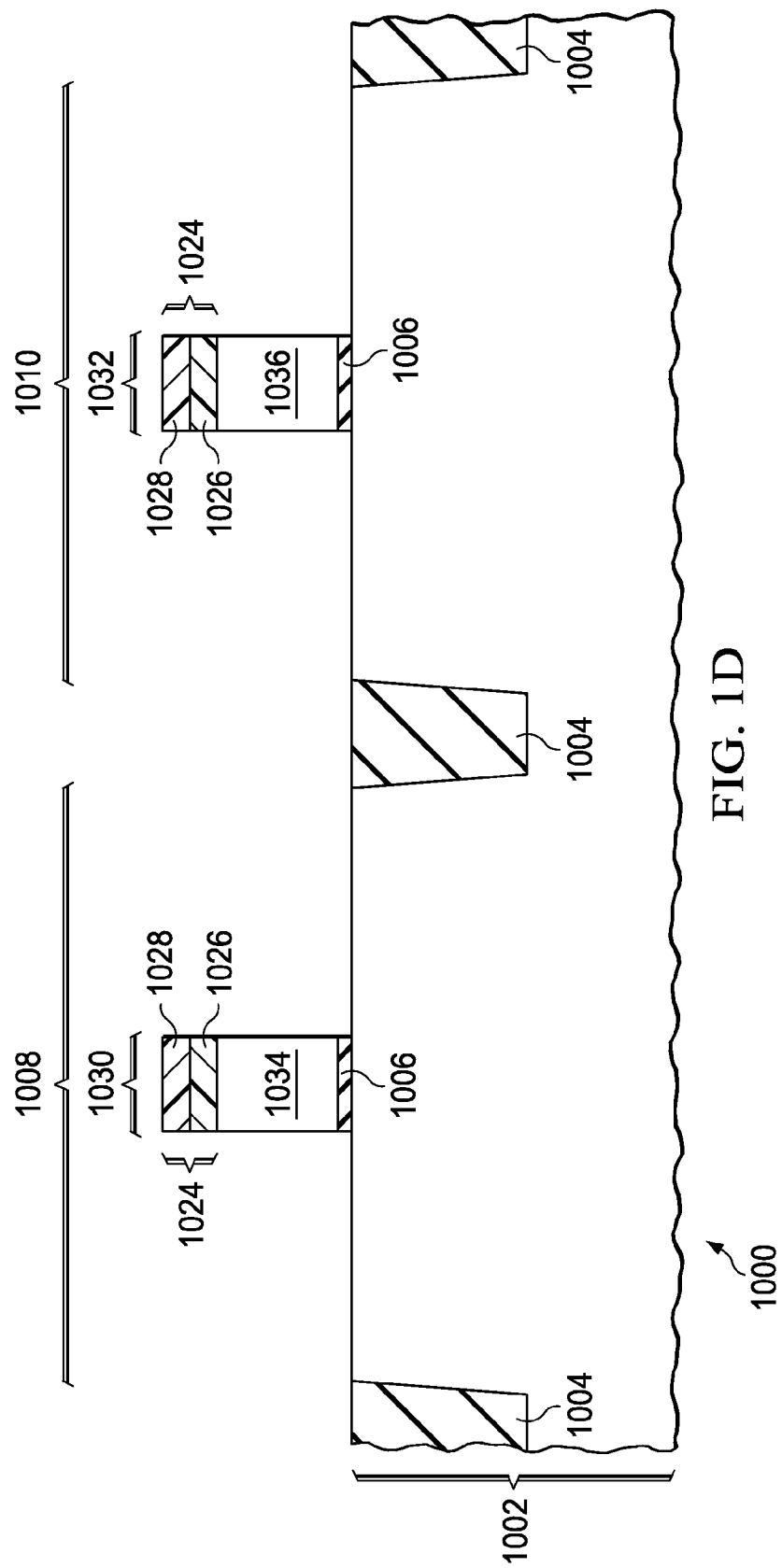
Figure 1E:
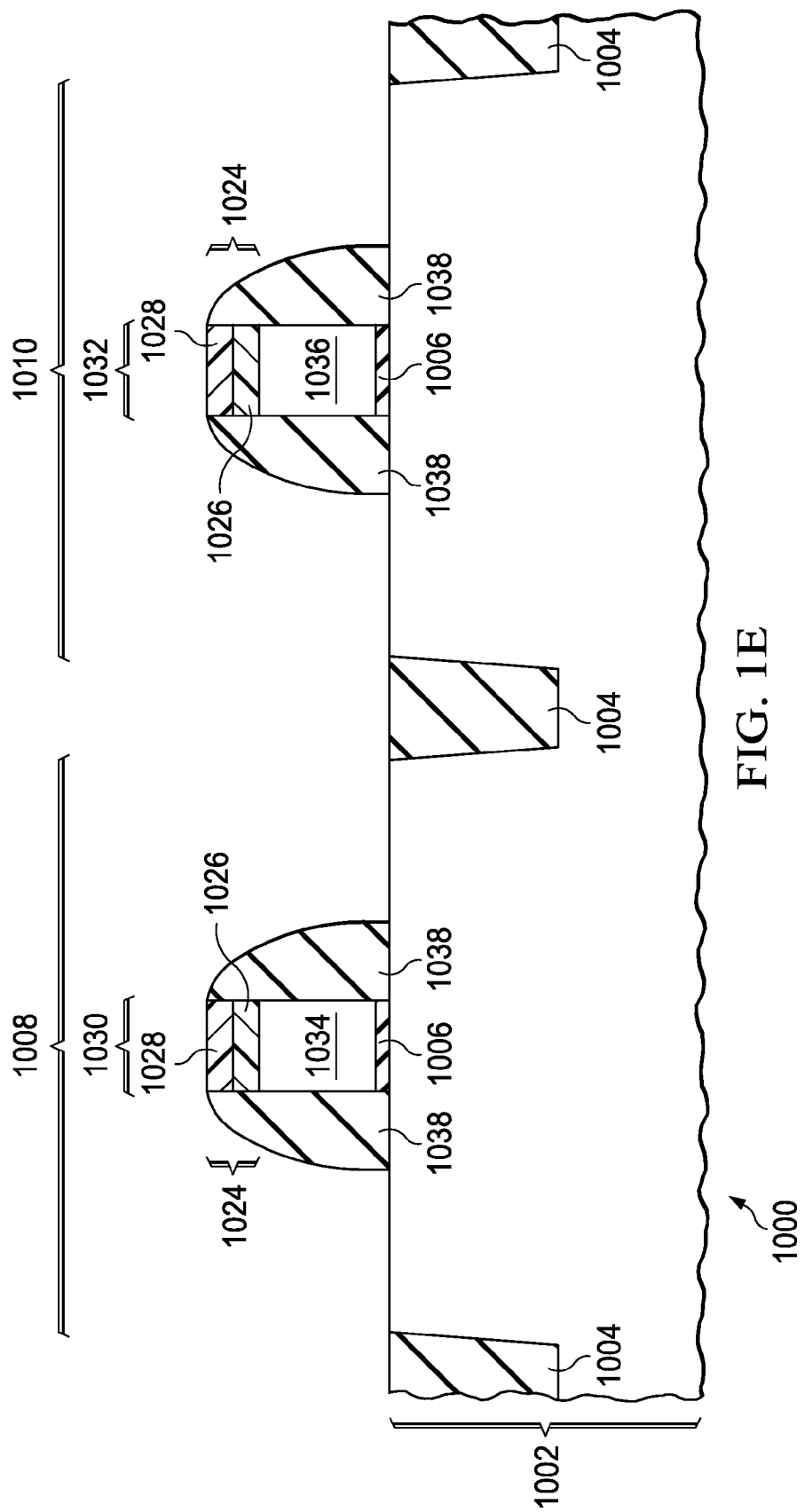
Figure 1F:
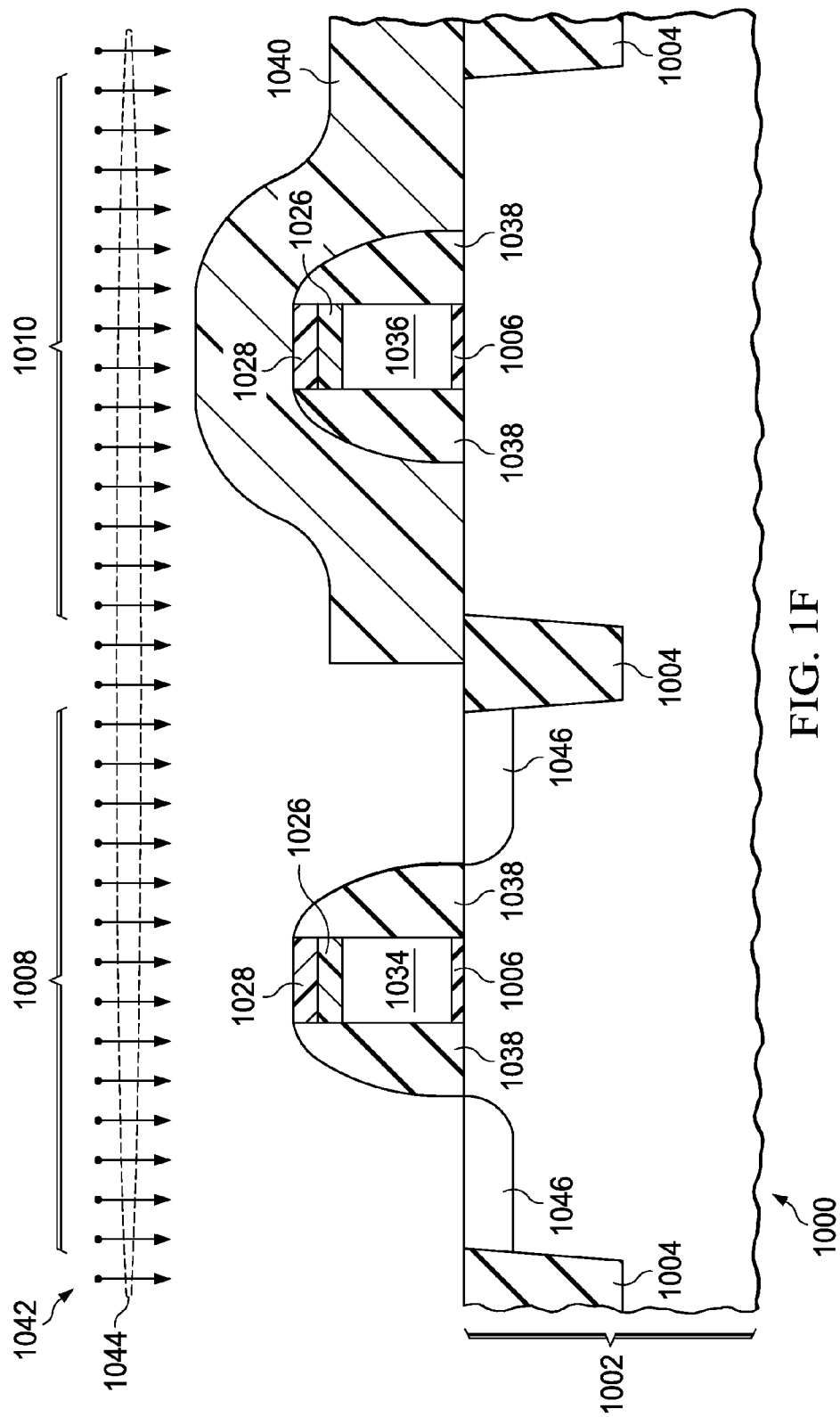
Figure 1G:
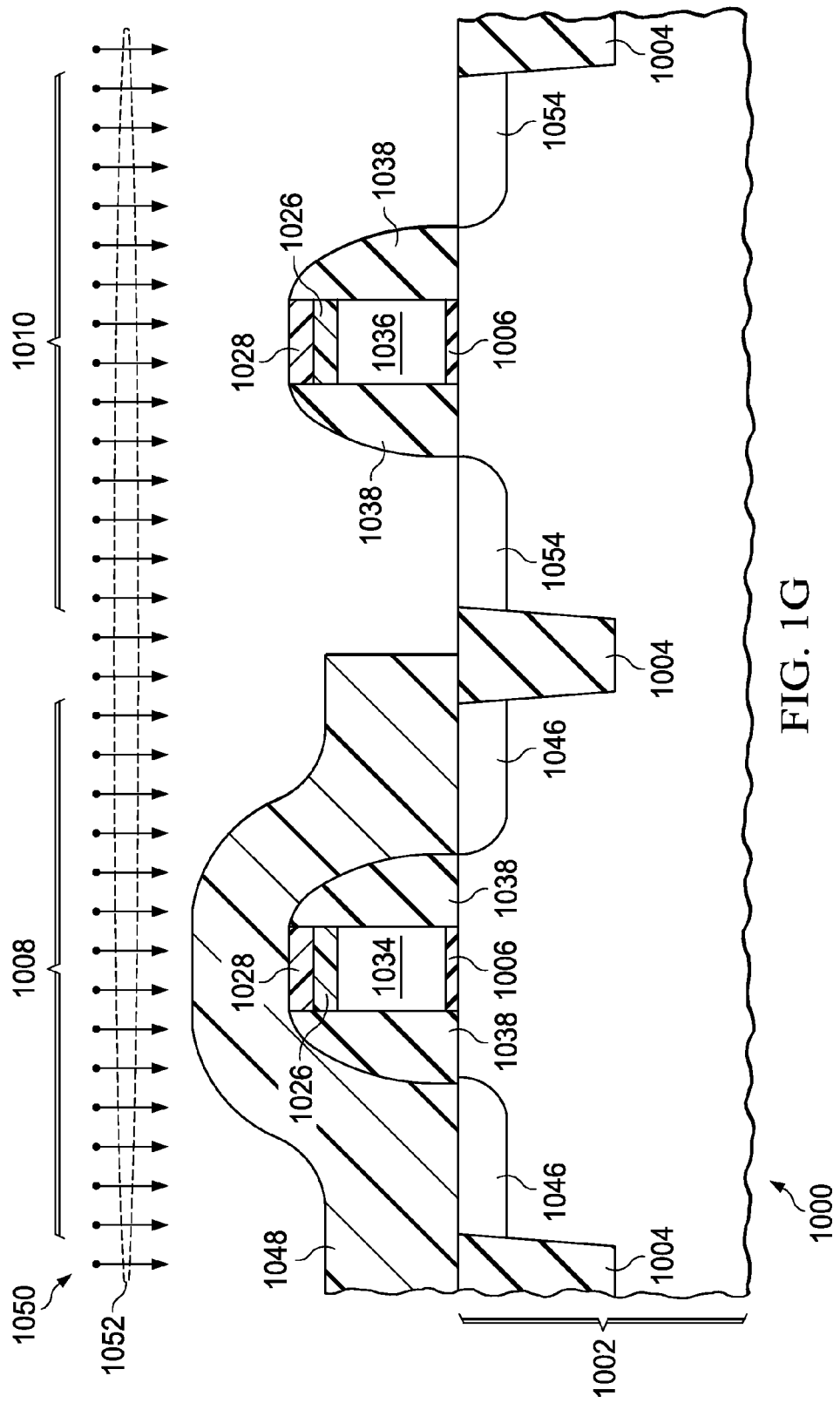
Figure 1I:
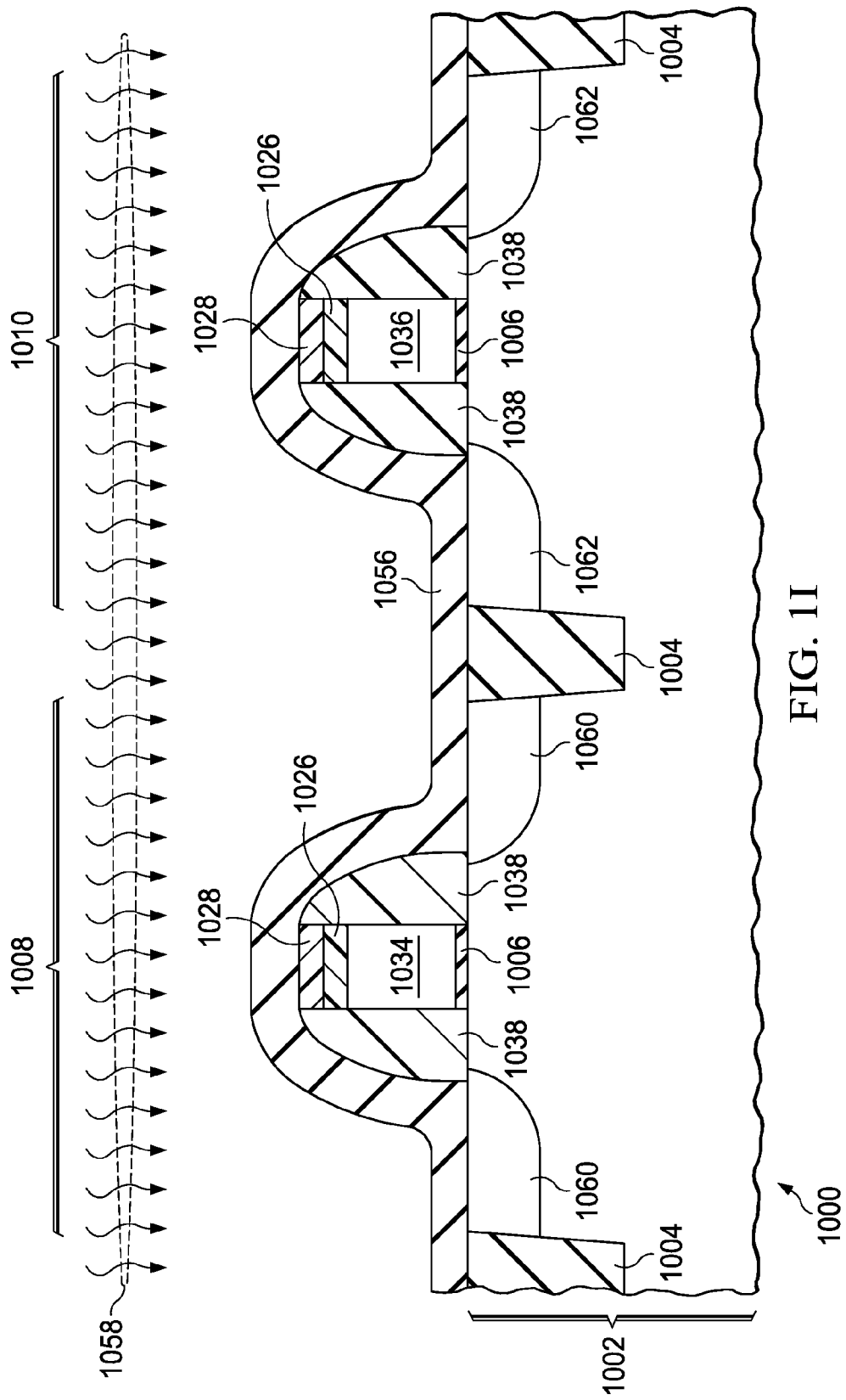
Figure 1J:
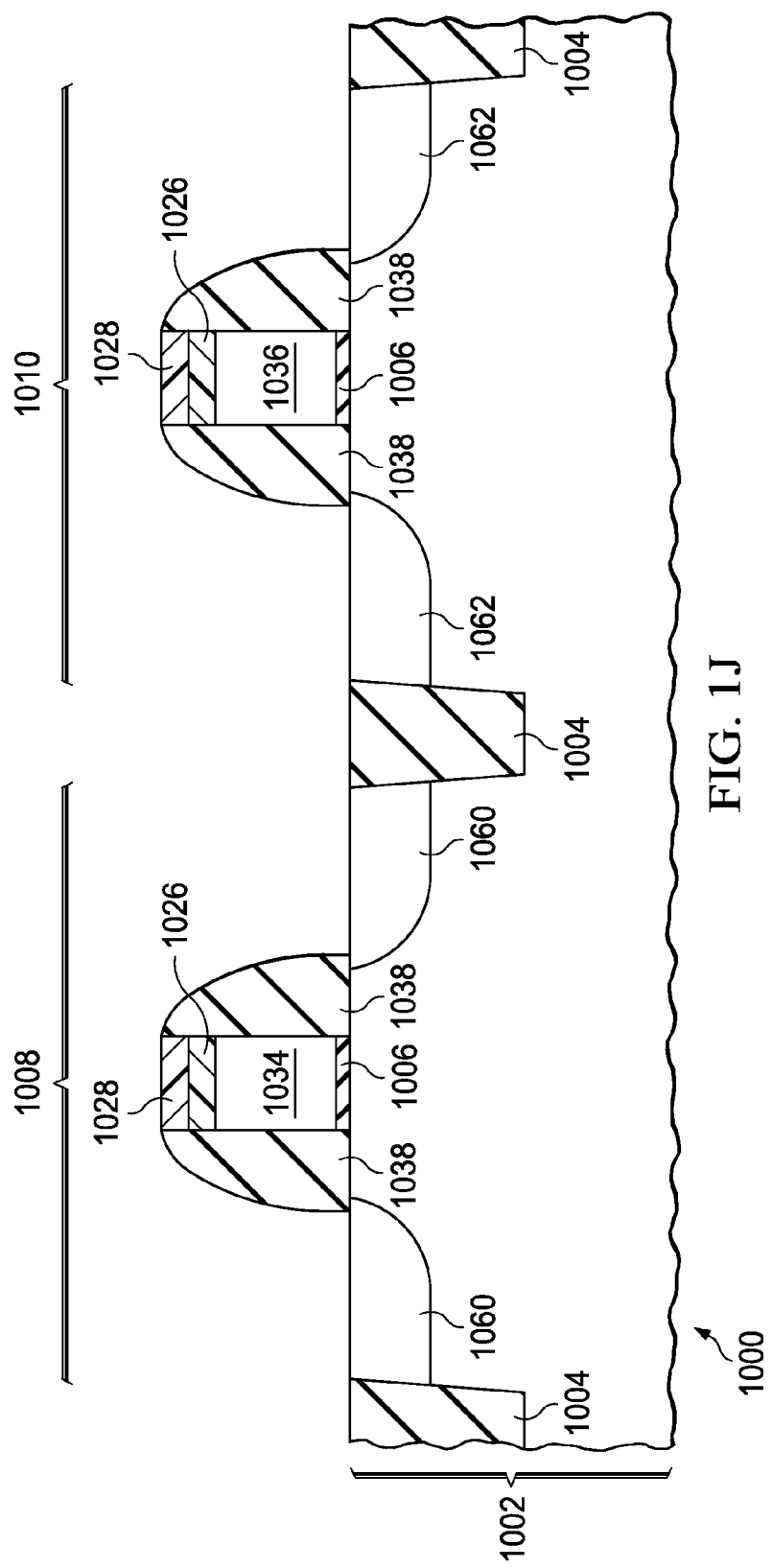
Figure 1K:
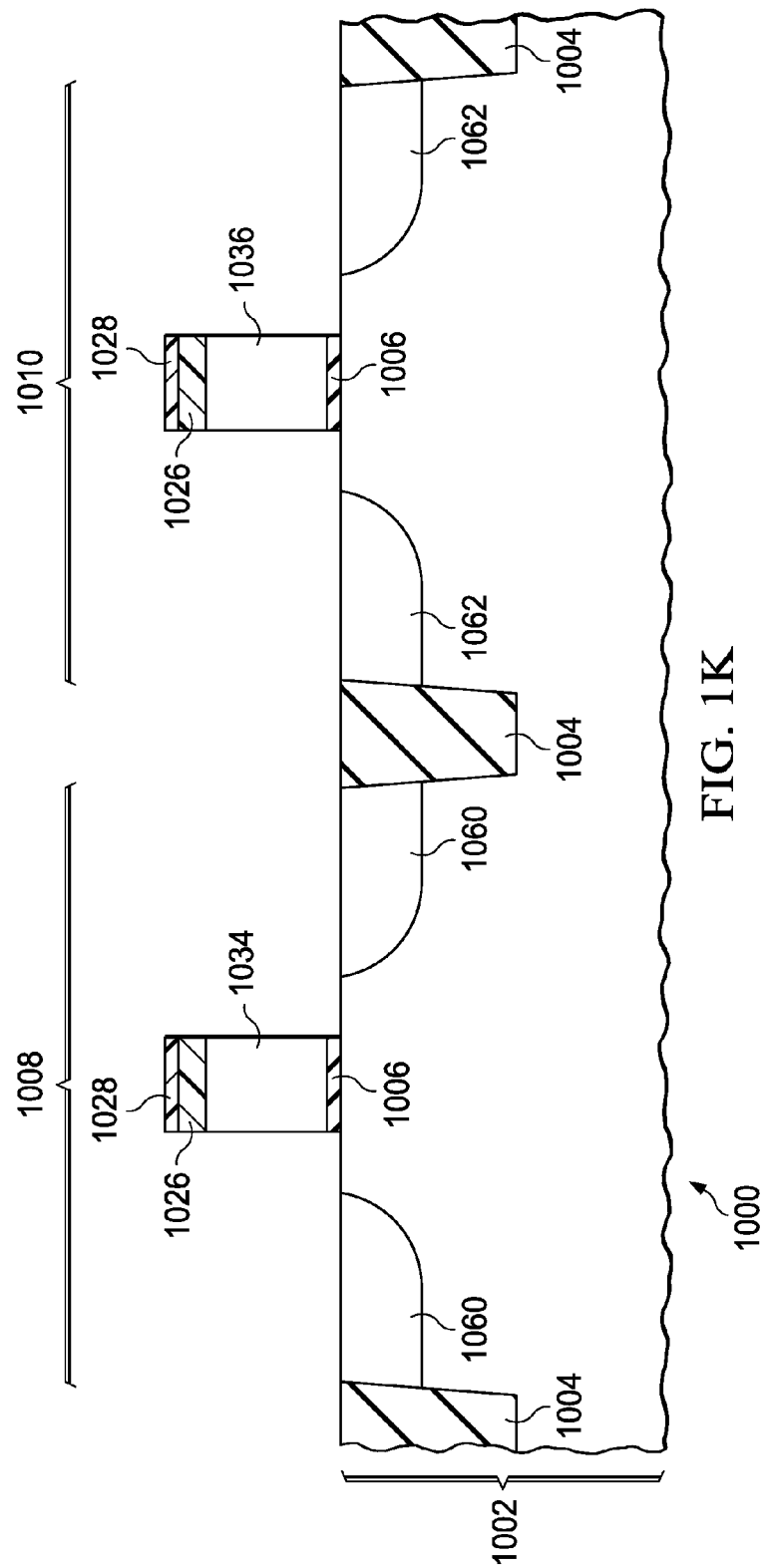
Figure 1L:
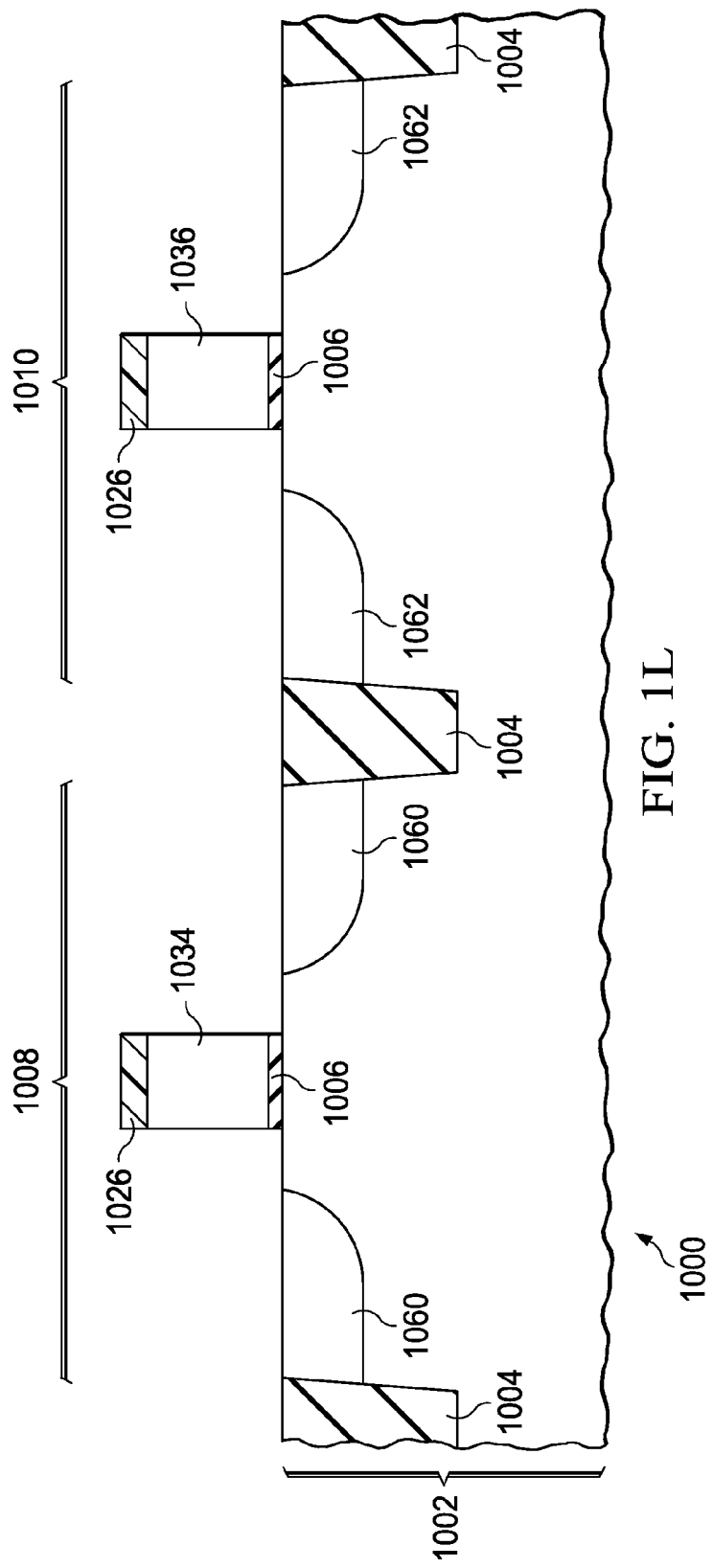
Figure 1M:
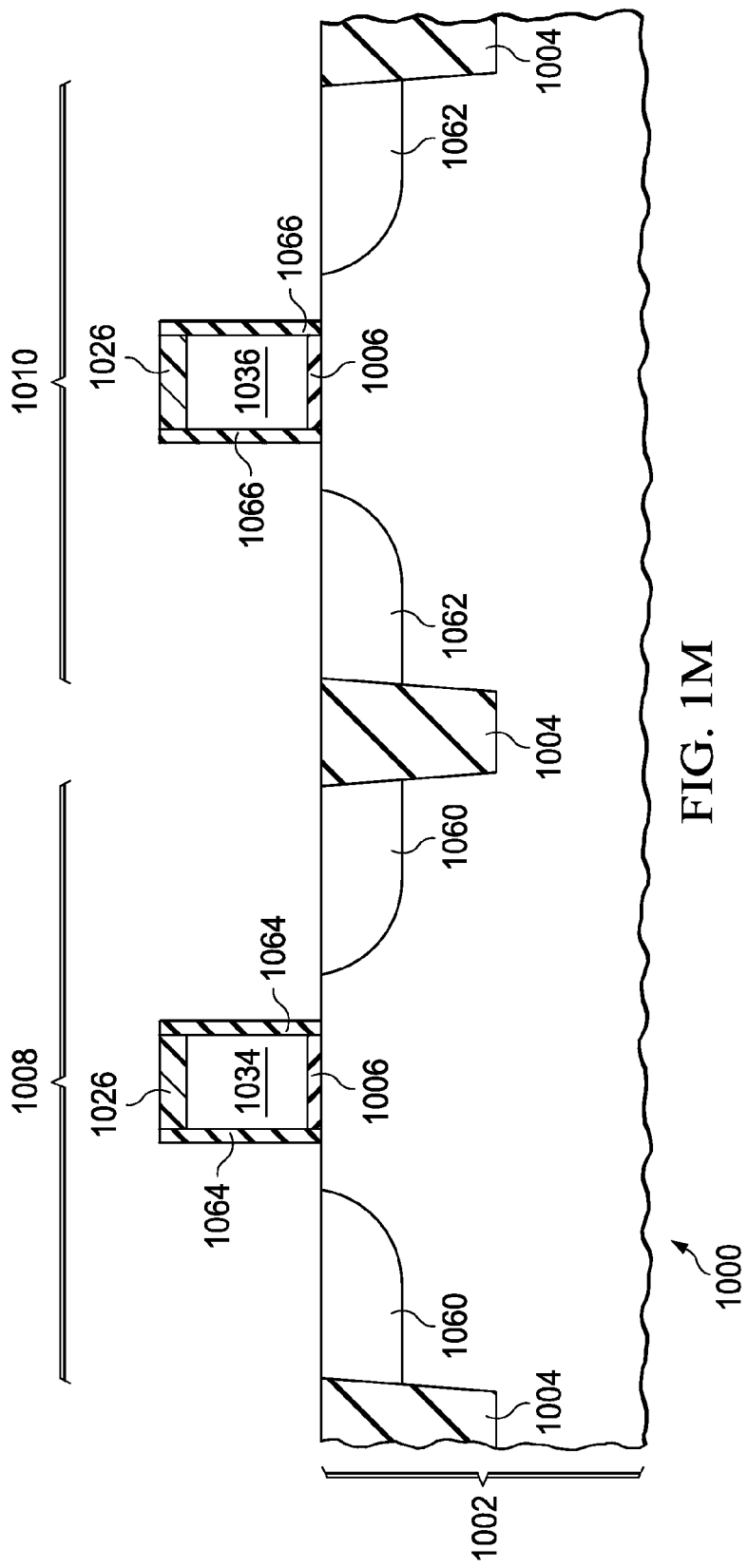
Figure 1N:
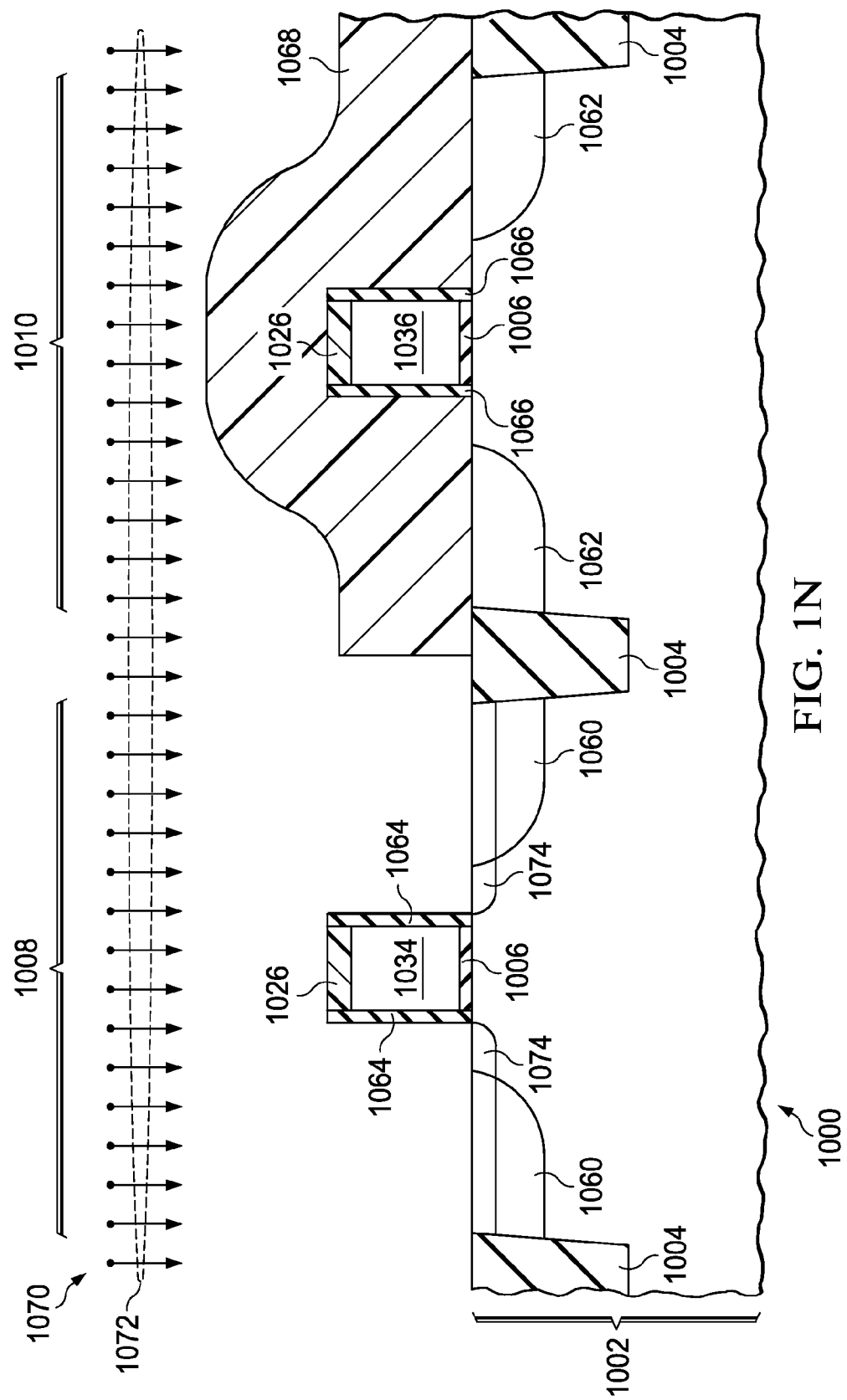
Figure 1O:
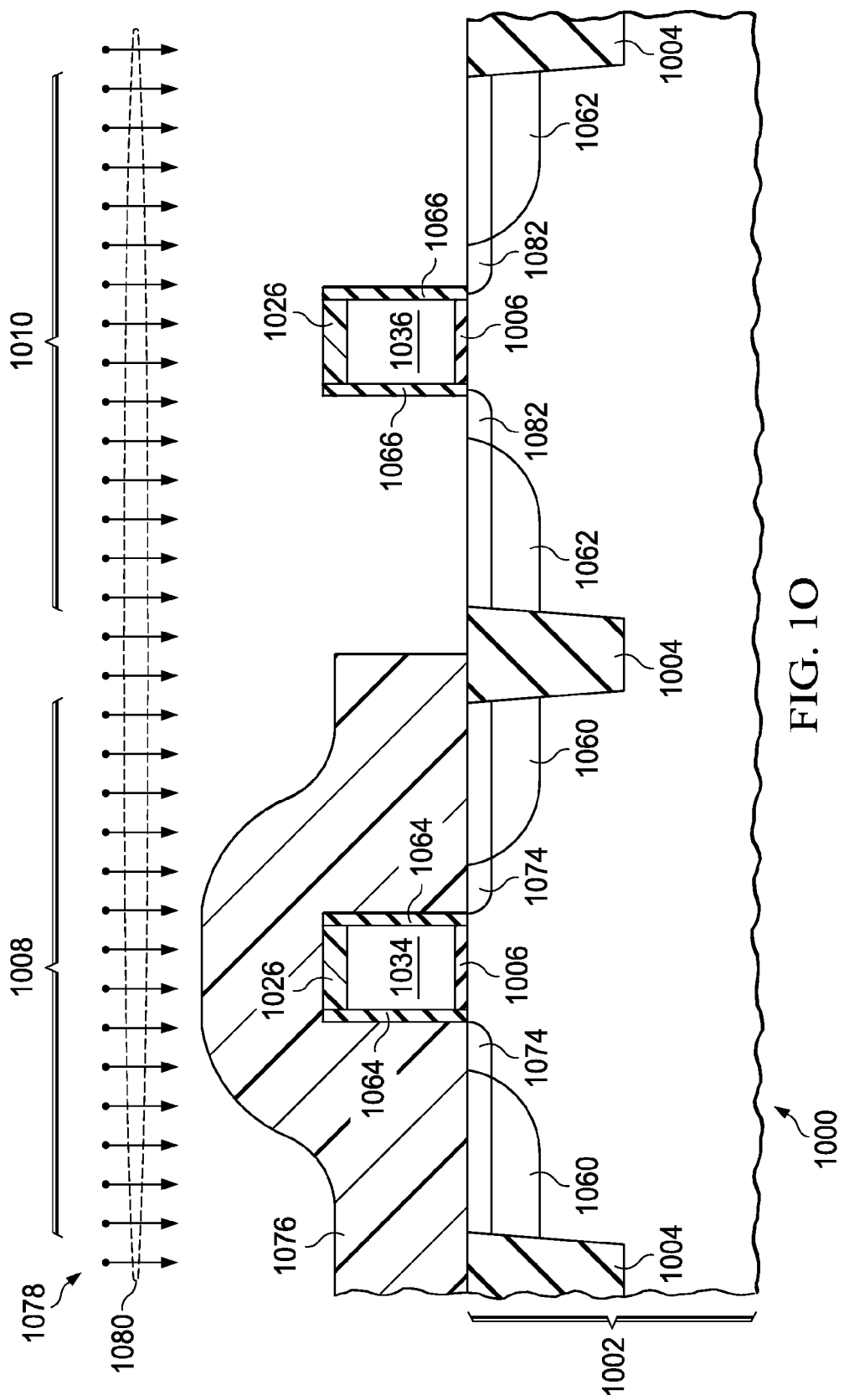
Figure 1P:
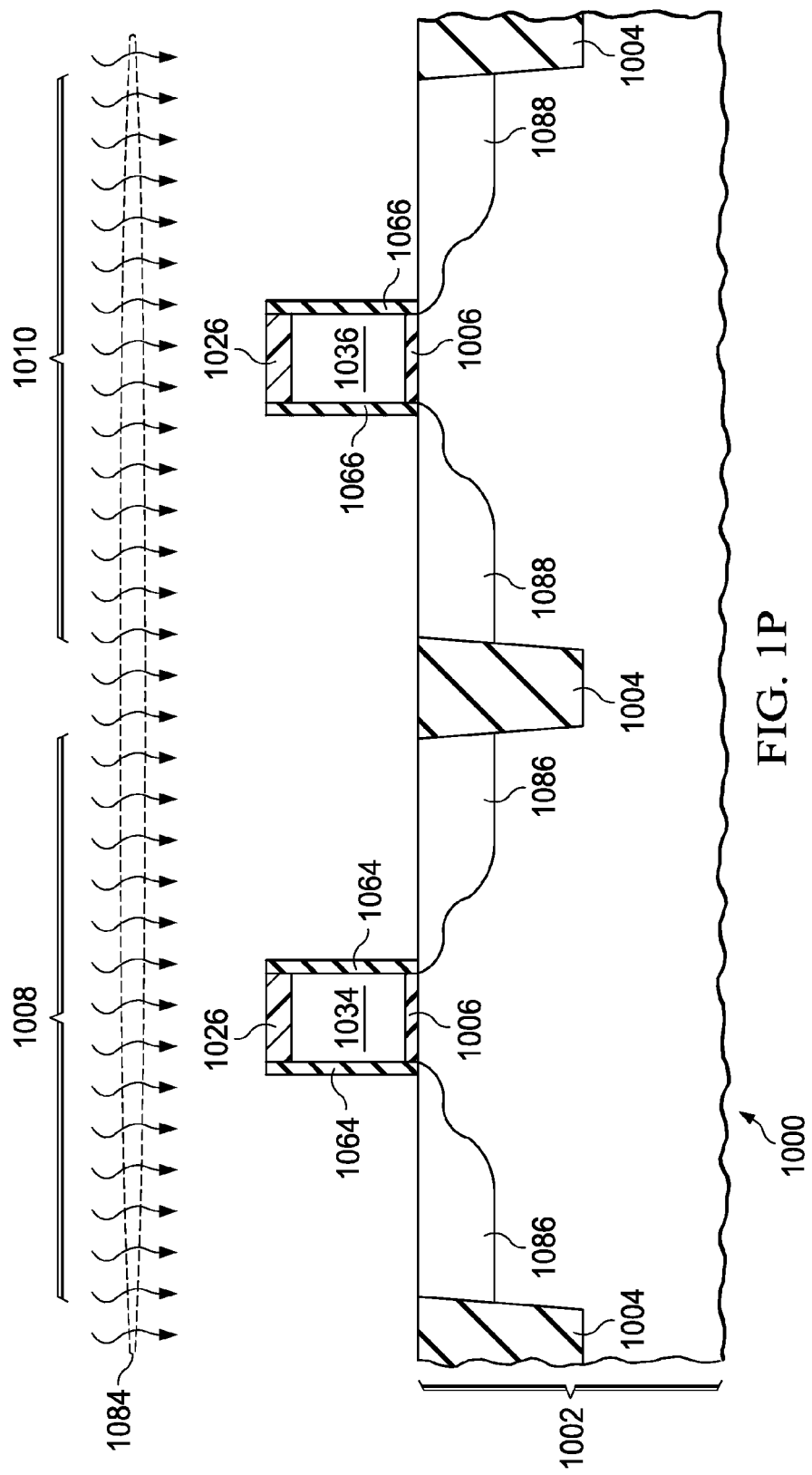
Figure 1Q:
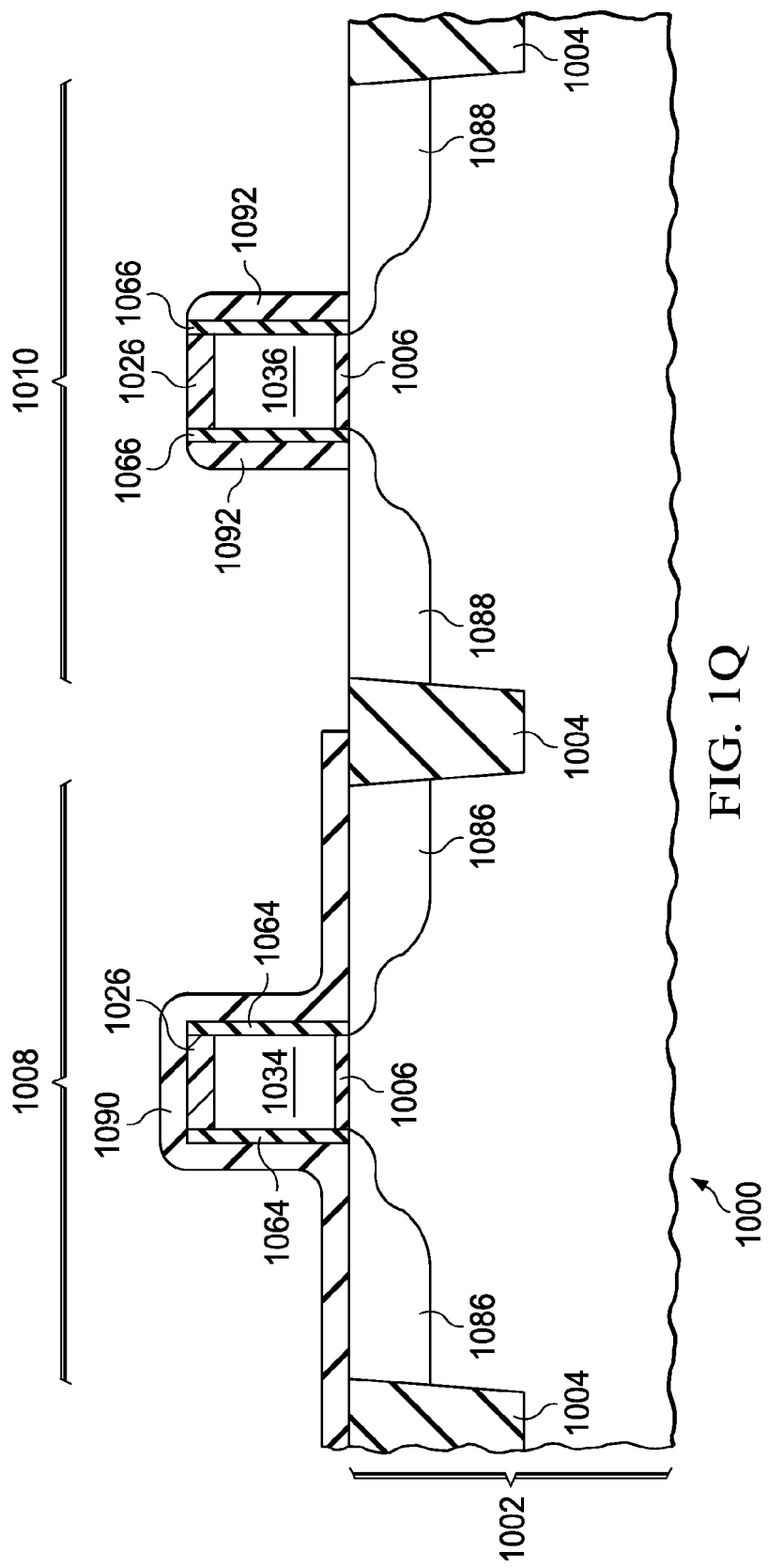
Figure 1R:
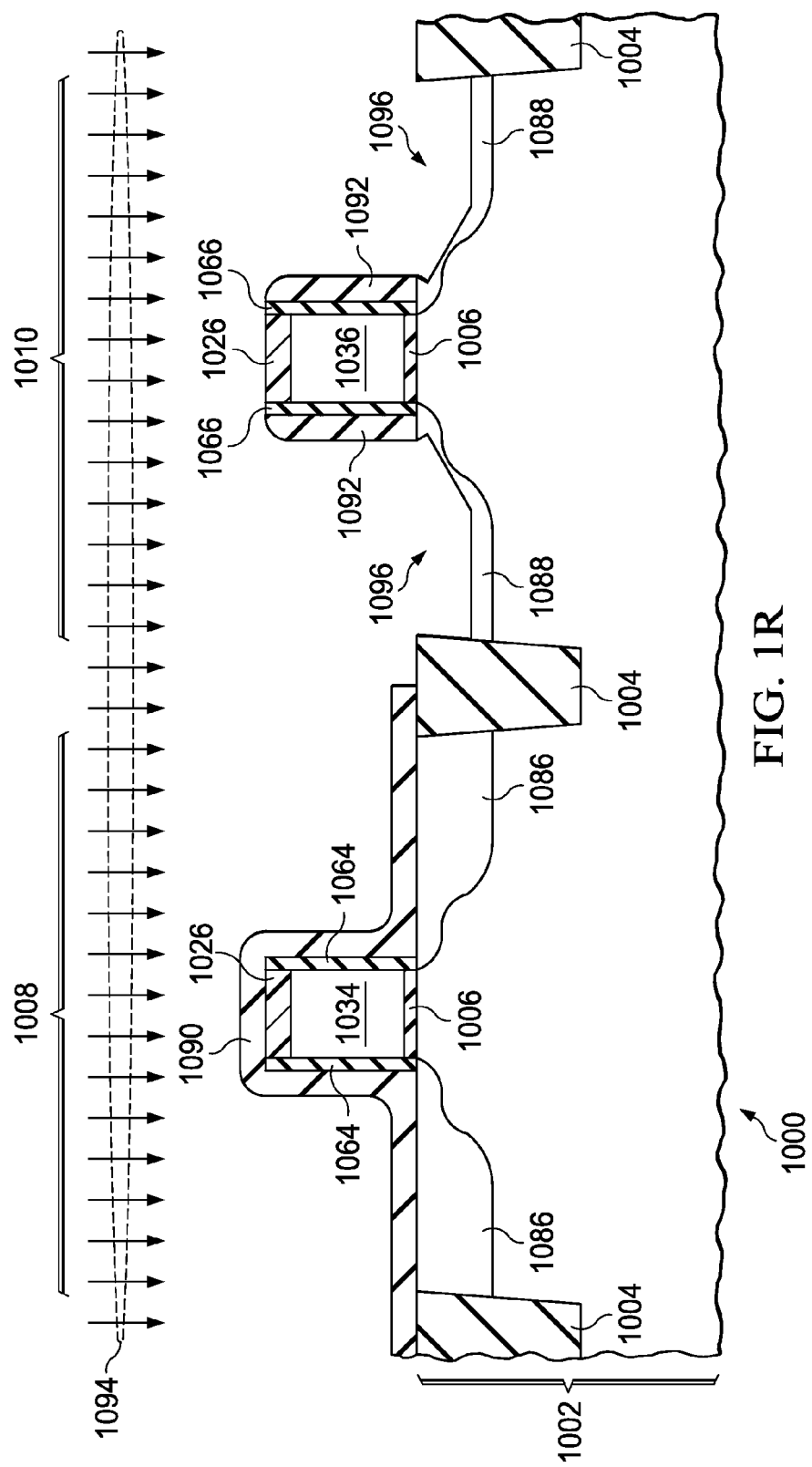
Figure 1S:
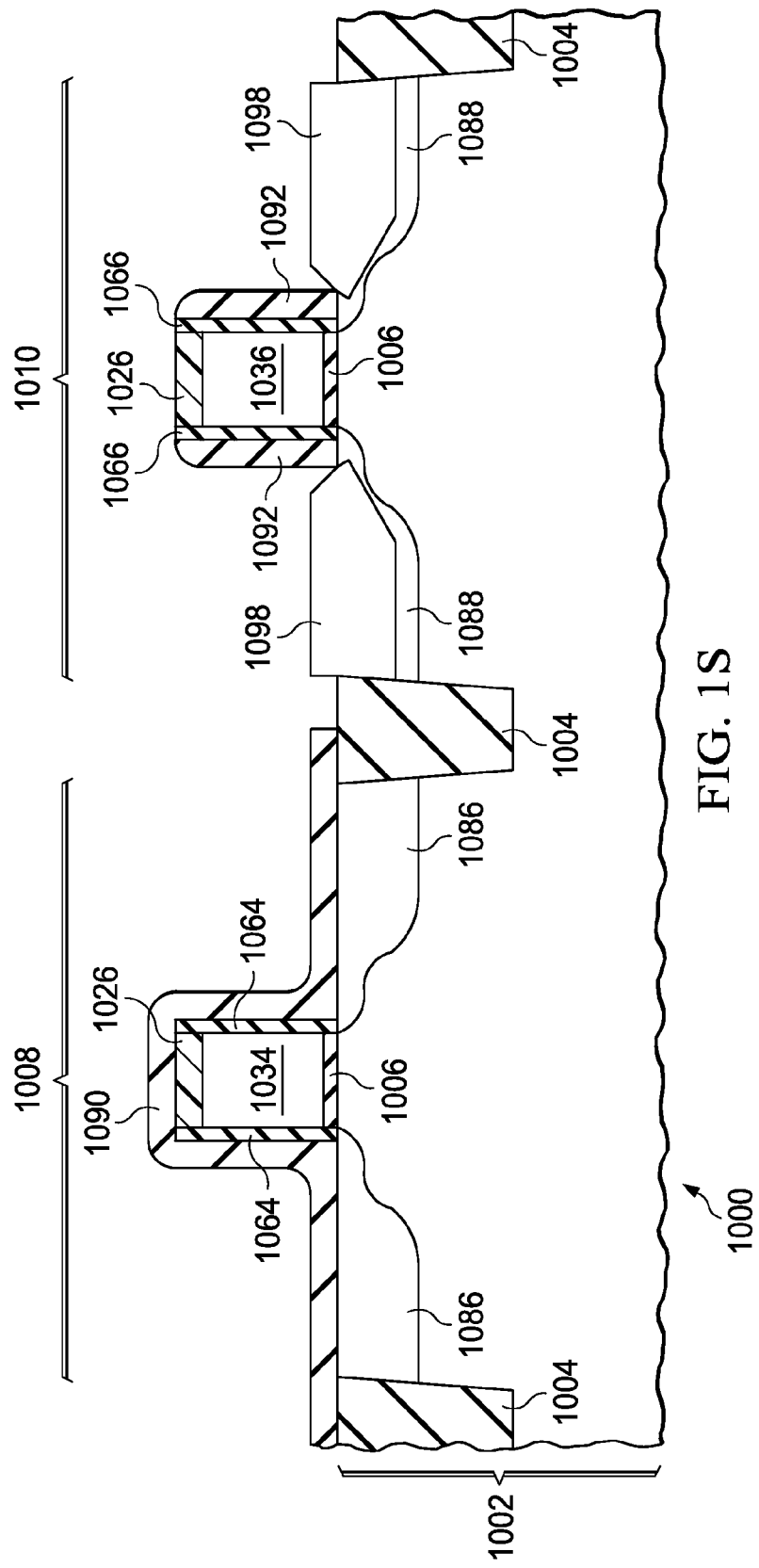
Figure 1T:
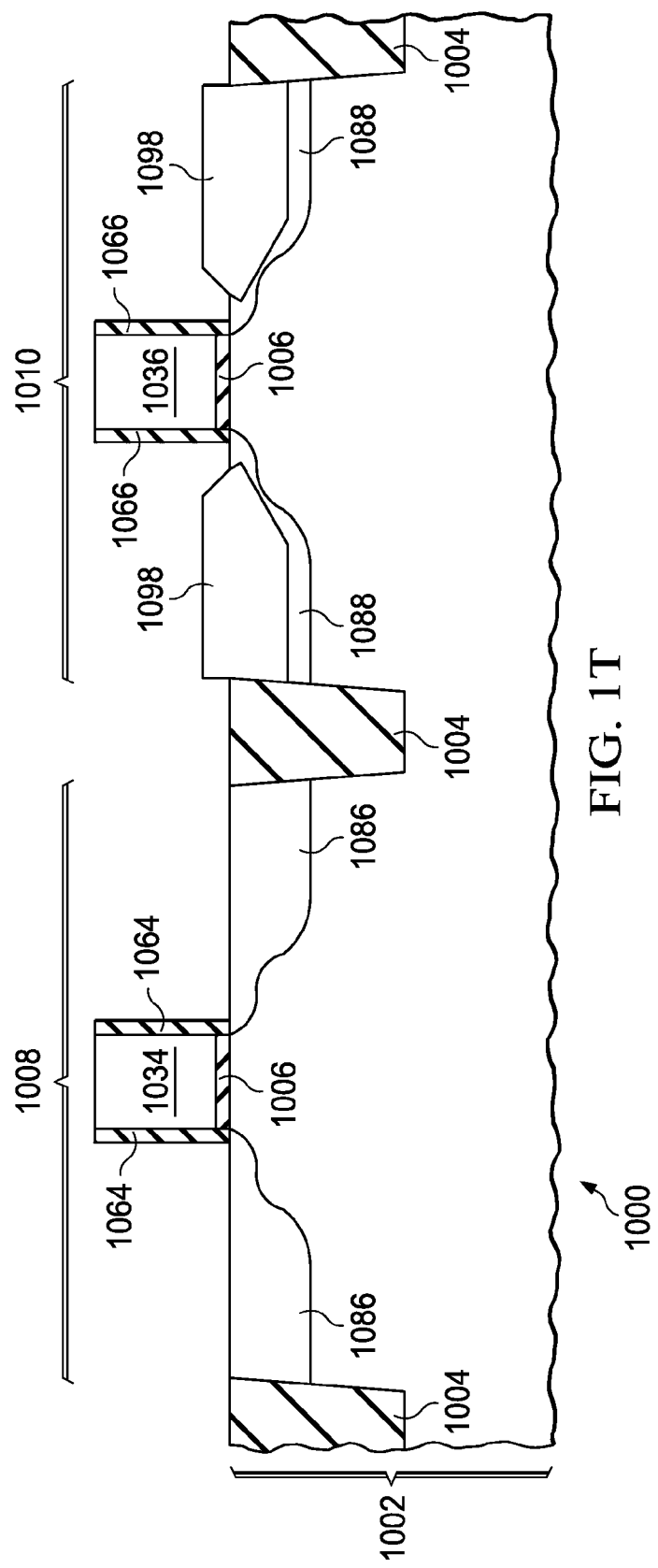
Figure 1U:
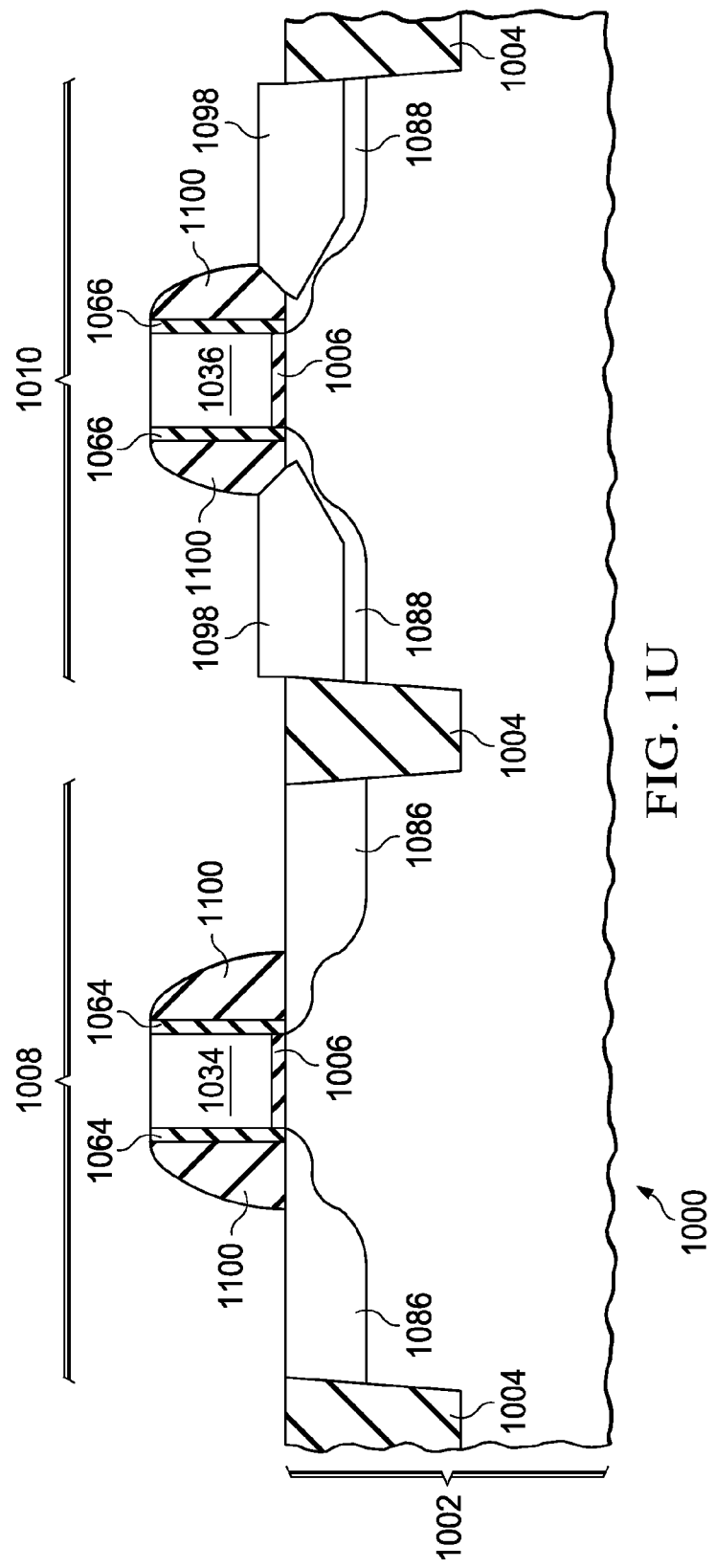
Figure 1V:
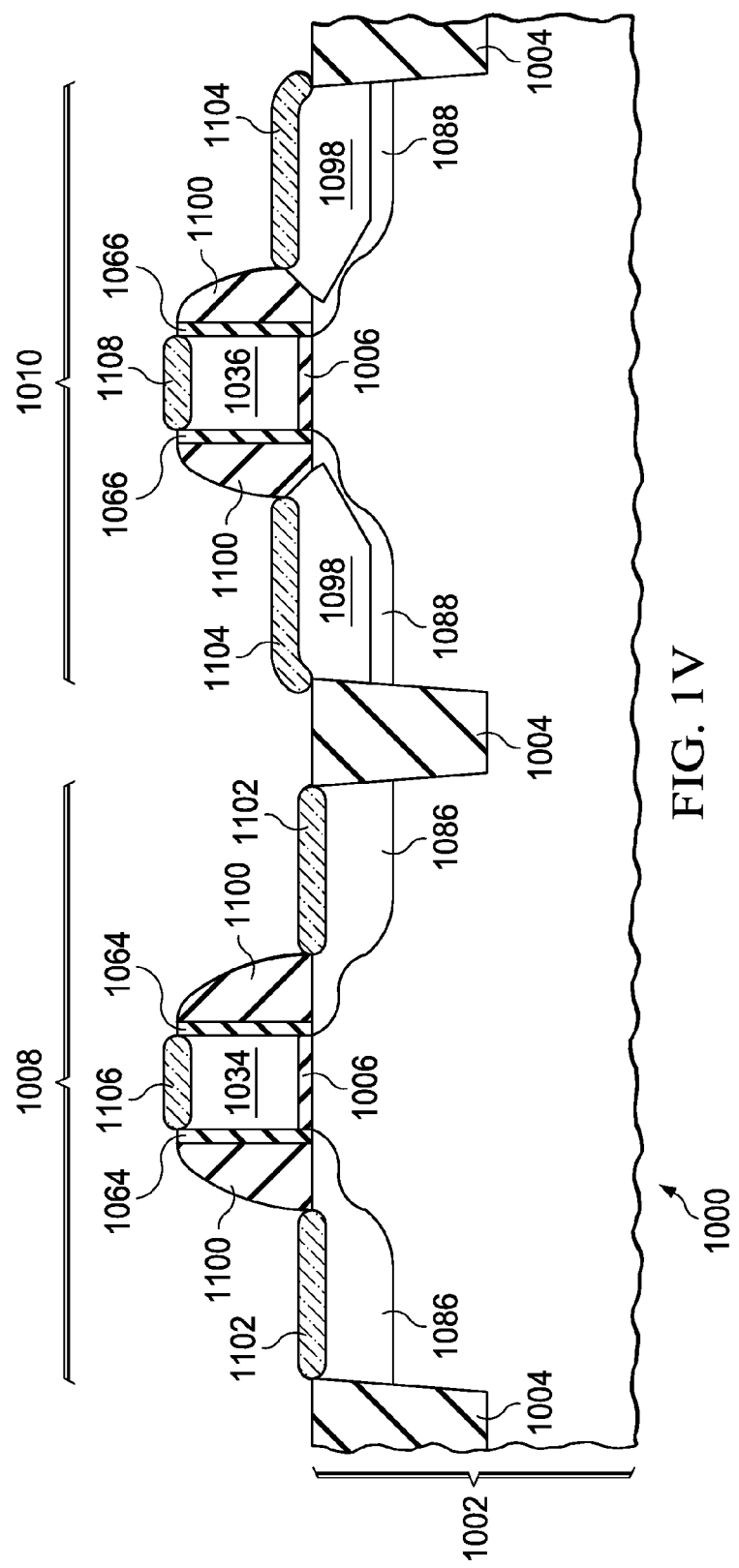

FIG. 1A through FIG. 1V are cross-sections of a CMOS integrated circuits formed according to an embodiment, depicted in successive stages of fabrication. Referring to FIG. 1A, the integrated circuit 1000 is formed in and on a silicon substrate 1002, which may be a single crystal silicon wafer, a silicon-on-insulator (SOI) wafer, a hybrid orientation technology (HOT) wafer with regions of different silicon crystal orientations, or other silicon substrate appropriate for fabrication of the integrated circuit 1000. Elements of field oxide 1004 are formed at a top surface of the substrate 1002, typically of silicon dioxide between 250 and 400 nanometers thick, commonly by shallow trench isolation (STI) processes. In STI processes, silicon dioxide may be deposited by high density plasma (HDP) or high aspect ratio process (HARP). A gate dielectric layer 1006 is formed on a top surface of the substrate 1002 in an area defined for an NMOS transistor 1008 and an area defined for a PMOS transistor 1010. In one realization of the instant embodiment, the gate dielectric layer 1006 may have a different composition or thickness in the NMOS transistor 1008 area than in the PMOS transistor 1010 area. A polysilicon gate layer 1012 is formed on a top surface of the gate dielectric layer 1006. In one realization of the instant embodiment, the polysilicon gate layer 1012 may be between 50 and 100 nanometers thick. A blanket gate ion implant operation 1014 is performed on the integrated circuit 1000 in which a first set of gate dopants 1016 is ion implanted into the polysilicon gate layer 1012 in both the NMOS transistor 1008 area and the PMOS transistor 1010 area. In one realization of the instant embodiment, the blanket gate ion implant operation 1014 may amorphize a top region of the polysilicon gate layer 1012.

Referring to FIG. 1B, a gate doping photoresist pattern 1018 is formed over the polysilicon gate layer 1012 in one of the NMOS transistor 1008 area or the PMOS transistor 1010 area, so that the other of the NMOS transistor 1008 area or the PMOS transistor 1010 area is exposed. A patterned gate ion implant operation 1020 is performed on the integrated circuit 1000 in which a second set of gate dopants 1022 is ion implanted into the polysilicon gate layer 1012 in the region exposed by the gate doping photoresist pattern 1018. In one realization of the instant embodiment, the patterned gate ion implant operation 1020 may amorphize a top region of the polysilicon gate layer 1012 in the region exposed by the gate doping photoresist pattern 1018. In one realization, the first set of gate dopants 1016 may include p-type dopants, the gate doping photoresist pattern 1018 may expose the NMOS transistor 1008 area as depicted in FIG. 1B and the second set of gate dopants 1022 may include n-type dopants. In an alternate realization, the first set of gate dopants 1016 may include n-type dopants, the gate doping photoresist pattern 1018 may expose the PMOS transistor 1010 area and the second set of gate dopants 1022 may include p-type dopants. After the patterned gate ion implant operation 1020 is completed, the gate doping photoresist pattern 1018 is removed, for example by exposing the integrated circuit 1000 to an oxygen containing plasma, followed by a wet cleanup to remove any organic residue from an existing top surface of the integrated circuit 1000. In one realization of the instant embodiment, the blanket gate ion implant operation 1014 may be performed subsequent to the patterned gate ion implant operation 1020.

Referring to FIG. 1C, a dual layer hard mask 1024 is formed on a top surface of the polysilicon gate layer 1012. The dual layer hard mask 1024 includes a lower hard mask layer 1026 contacting the top surface of the polysilicon gate layer 1012 and an upper hard mask layer 1028 over the lower hard mask layer 1026. In one realization of the instant embodiment, the lower hard mask layer 1026 may be between 10 and 30 nanometers thick, and the upper hard mask layer 1028 may be between 20 and 40 nanometers thick. In one realization of the instant embodiment, the lower hard mask layer 1026 may include silicon nitride. In an alternate realization, the lower hard mask layer 1026 may include silicon oxy-nitride. In another realization, the lower hard mask layer 1026 may include another dielectric material with etch selectivities to polysilicon and silicon dioxide greater than 2:1. In one realization of the instant embodiment, the upper hard mask layer 1028 may include silicon dioxide. In an alternate realization, the upper hard mask layer 1028 may include a dielectric material with etch selectivities to silicon nitride and the lower hard mask layer 1026 greater than 2:1.

Referring to FIG. 1D, the upper hard mask layer 1028, the lower hard mask layer 1026, the polysilicon gate layer 1012 and the gate dielectric layer 1006 are etched by a gate etch process so as to form an NMOS gate structure 1030 and a PMOS gate structure 1032. The NMOS gate structure 1030 includes the upper hard mask layer 1028, the lower hard mask layer 1026 and an n-type doped polysilicon gate 1034. The PMOS gate structure 1032 includes the upper hard mask layer 1028, the lower hard mask layer 1026 and a p-type doped polysilicon gate 1036.

Referring to FIG. 1E, source/drain sidewall spacers 1038 are formed on lateral surfaces of the NMOS gate structure 1030 and the PMOS gate structure 1032. The source/drain sidewall spacers 1038 may be formed by conformally depositing one or more layers of sidewall material on an existing top surface of the integrated circuit 1000 followed by an isotropic etch process which removes the sidewall material from horizontal surfaces of the integrated circuit 1000, leaving the source/drain sidewall spacers 1038. The sidewall material may include silicon nitride. In one realization of the instant embodiment, an etch selectivity of the upper hard mask layer 1028 to the sidewall material is greater than 2:1.

Referring to FIG. 1F, an NMOS source/drain (NSD) photoresist pattern 1040 is formed on an existing top surface of the integrated circuit 1000 over the PMOS transistor 1010 area, so as to expose the NMOS transistor 1008 area. An NSD ion implant operation 1042 is performed which ion implants an NSD set of dopants 1044 into the integrated circuit 1000 to form NSD implanted regions 1046 in the substrate 1002 adjacent to the source/drain sidewall spacers 1038 in the NMOS transistor 1008 area.

Referring to FIG. 1G, an optional PSD photoresist pattern 1048 is formed on an existing top surface of the integrated circuit 1000 over the NMOS transistor 1008 area, so as to expose the PMOS transistor 1010 area. An optional PSD ion implant operation 1050 is performed which ion implants a PSD set of dopants 1052 into the integrated circuit 1000 to form PSD implanted regions 1054 in the substrate 1002 adjacent to the source/drain sidewall spacers 1038 in the PMOS transistor 1010 area. In an alternate realization of the instant embodiment, the PSD implanted regions 1054 may not be formed.

Referring to FIG. 1H, an optional stress memorization layer 1056 may be formed on an existing top surface of the integrated circuit 1000. In one realization of the instant embodiment, the stress memorization layer 1056 if formed may be under compressive stress. In an alternate realization, the stress memorization layer 1056 if formed may be under tensile stress. In one realization, the stress memorization layer 1056 may be removed from the NMOS transistor 1008 area or the PMOS transistor 1010 area prior to a subsequent source/drain anneal operation. The stress memorization layer 1056 may include one or more layers of silicon nitride, silicon dioxide, or other dielectric material.

Referring to FIG. 1I, a source/drain anneal operation 1058, depicted schematically in FIG. 1I as irradiation with optical energy, is performed which heats an existing top surface of the integrated circuit 1000 with a sufficient time/temperature profile to repair a portion of lattice damage from the NSD ion implant operation 1042 of FIG. 1F and to activate a portion of the NSD dopants in the NSD implanted regions 1046 of FIG. 1F so as to form NSD annealed regions 1060 in the substrate 1002 adjacent to the adjacent to the source/drain sidewall spacers 1038 in the NMOS transistor 1008 area. The source/drain anneal operation 1058 also repairs a portion of lattice damage from the PSD ion implant operation 1050 of FIG. 1G if performed, and activates a portion of the PSD dopants in the PSD implanted regions 1054 of FIG. 1G if formed so as to form PSD annealed regions 1062 in the substrate 1002 adjacent to the source/drain sidewall spacers 1038 in the PMOS transistor 1010 area. In one realization of the instant embodiment, the source/drain anneal operation 1058 may include a rapid thermal anneal operation which heats the existing top surface of the integrated circuit 1000 between 900 C and 1100 C for 5 seconds to 30 seconds. In an alternate realization, the source/drain anneal operation 1058 may include a rapid thermal spike anneal operation which heats the existing top surface of the integrated circuit 1000 between 1050 C to 1150 C for 300 milliseconds to 3 seconds. In another realization, the source/drain anneal operation 1058 may include a laser anneal which heats the existing top surface of the integrated circuit 1000 between 1150 C and 1250 C for 10 microseconds to 300 microseconds. In yet another realization, the source/drain anneal operation 1058 may include a laser spike anneal which heats the existing top surface of the integrated circuit 1000 between 1250 C and 1350 C for 10 nanoseconds to 10 microseconds. During the source/drain anneal operation 1058, the top region of the n-type doped polysilicon gate 1034 and the top region of the p-type doped polysilicon gate 1036, if previously amorphized, are recrystallized.

Referring to FIG. 1J, the stress memorization layer 1056 of FIG. 1I if formed is removed, for example by exposing the integrated circuit 1000 to a plasma etch process or a reactive ion etch process. Sufficient upper hard mask layer 1028 remains after removal of the stress memorization layer 1056 to protect the lower hard mask layer 1026 during a subsequent process to remove the source/drain sidewall spacers 1038.

Referring to FIG. 1K, the source/drain sidewall spacers 1038 of FIG. 1J are removed, for example by exposing the integrated circuit 1000 to a plasma etch process or a reactive ion etch process which has an etch selectivity between the upper hard mask layer 1028 and sidewall material of at least 2:1. A portion of the upper hard mask layer 1028 may be removed during the removal of the source/drain sidewall spacers 1038. The thickness of the lower hard mask layer 1026 is not reduced during the removal of the source/drain sidewall spacers 1038. Other processes for removing the source/drain sidewall spacers 1038 are within the scope of the instant embodiment.

Referring to FIG. 1L, the upper hard mask layer 1028 of FIG. 1K is removed, for example by exposing the integrated circuit 1000 to a plasma etch process or a reactive ion etch process which has an etch selectivity between the lower hard mask layer 1026 and the upper hard mask layer 1028 of at least 2:1. Sufficient lower hard mask layer 1026, for example at least 15 nanometers, remains after removal of the upper hard mask layer 1028 to block SiGe growth on the p-type doped polysilicon gate 1036.

Referring to FIG. 1M, optional NMOS LDD spacers 1064 may be formed on lateral surfaces of the n-type doped polysilicon gate 1034. The NMOS LDD spacers 1064 may be formed for example by conformally depositing one or more layers of dielectric material on an existing top surface of the integrated circuit 1000 followed by isotropic etching to remove the dielectric material from horizontal areas of the existing top surface, leaving the NMOS LDD spacers 1064. Similarly, optional PMOS LDD spacers 1066 may be formed on lateral surfaces of the p-type doped polysilicon gate 1036. In one realization of the instant embodiment, a portion or all of the NMOS LDD spacers 1064 and the PMOS LDD spacers 1066 may be formed concurrently.

Referring to FIG. 1N, an NMOS LDD (NLDD) photoresist pattern 1068 is formed on an existing top surface of the integrated circuit 1000 over the PMOS transistor 1010 area, so as to expose the NMOS transistor 1008 area. An NLDD ion implant operation 1070 is performed which ion implants an NLDD set of dopants 1072 into the integrated circuit 1000 to form NLDD implanted regions 1074 in the substrate 1002 adjacent to the n-type doped polysilicon gate 1034 in the NMOS transistor 1008 area.

Referring to FIG. 1O, a PMOS LDD (PLDD) photoresist pattern 1076 is formed on an existing top surface of the integrated circuit 1000 over the NMOS transistor 1008 area, so as to expose the PMOS transistor 1010 area. A PLDD ion implant operation 1078 is performed which ion implants a PLDD set of dopants 1080 into the integrated circuit 1000 to form PLDD implanted regions 1082 in the substrate 1002 adjacent to the p-type doped polysilicon gate 1036 in the PMOS transistor 1010 area.

FIG. 1P depicts the integrated circuit after an LDD anneal operation 1084, depicted schematically in FIG. 1I as irradiation with optical energy, which heats an existing top surface of the integrated circuit 1000 with a sufficient time/temperature profile to repair a portion of lattice damage from the NLDD ion implant operation 1070 of FIG. 1N and the PLDD ion implant operation 1078 of FIG. 1O and to activate a portion of the NLDD dopants in the NLDD implanted regions 1074 of FIG. 1N and the PLDD dopants in the PLDD implanted regions 1082 of FIG. 1O. The NLDD implanted regions 1074 merge with the NSD annealed regions 1060 of FIG. 1O to form NMOS source/drain diffused regions 1086. If the PSD annealed regions 1062 of FIG. 1O are present, the PLDD implanted regions 1082 merge with the PSD annealed regions 1062 to form PMOS source/drain diffused regions 1088. If the PSD annealed regions 1062 are not present, the PLDD implanted regions 1082 form PLDD diffused regions, not shown, during the LDD anneal operation 1084. In one realization of the instant embodiment, the LDD anneal operation 1084 may include a rapid thermal anneal operation which heats the existing top surface of the integrated circuit 1000 between 900 C and 1100 C for 5 seconds to 30 seconds. In an alternate realization, the LDD anneal operation 1084 may include a rapid thermal spike anneal operation which heats the existing top surface of the integrated circuit 1000 between 1050 C to 1150 C for 300 milliseconds to 3 seconds. In another realization, the LDD anneal operation 1084 may include a laser anneal which heats the existing top surface of the integrated circuit 1000 between 1150 C and 1250 C for 10 microseconds to 300 microseconds. In yet another realization, the LDD anneal operation 1084 may include a laser spike anneal which heats the existing top surface of the integrated circuit 1000 between 1250 C and 1350 C for 10 nanoseconds to 10 microseconds.

FIG. 1Q depicts the integrated circuit 1000 after formation of a SiGe blocking layer 1090 formed on an existing top surface of the integrated circuit 1000 in the NMOS transistor 1008 area, so as to expose the PMOS transistor 1010 area. The SiGe blocking layer 1090 may include one or more layers of silicon nitride, silicon dioxide, silicon oxy-nitride, or other dielectric material which blocks growth of SiGe epitaxial material. In one realization of the instant embodiment, the SiGe blocking layer 1090 may be between 10 and 40 nanometers thick. The SiGe blocking layer 1090 may be formed by forming the layer or layers of SiGe blocking dielectric material on the existing top surface of the integrated circuit 1000, forming a SiGe block photoresist pattern on a top surface of the layers of SiGe blocking dielectric material which covers the NMOS transistor 1008 area and exposes the PMOS transistor 1010 area, removing the SiGe blocking dielectric material from the PMOS transistor 1010 area using a plasma etch process, followed by removing the SiGe block photoresist pattern by exposing the integrated circuit 1000 to an oxygen containing plasma, followed by a wet cleanup to remove any organic residue from the top surface of the SiGe blocking layer 1090. Process steps to form the SiGe blocking layer 1090 may be performed so as to concurrently form optional SiGe spacers 1092 on lateral surfaces of the PMOS LDD spacers 1066 if present or on lateral surfaces of the p-type doped polysilicon gate 1036 if the PMOS LDD spacers 1066 are not present. A width of the SiGe spacers 1092 if formed may be between 50 percent and 100 percent of the thickness of the SiGe blocking layer 1090.

Referring to FIG. 1R, a SiGe recess etch process 1094, depicted schematically in FIG. 1R as a reactive ion etch process, is performed on the integrated circuit 1000 to form SiGe recesses 1096 in the substrate 1002 adjacent to the p-type doped polysilicon gate 1036. A contour of the SiGe recesses 1096 may be rectangular or more complex, for example a faceted undercut profile sometimes referred to as diamond shaped. A depth of the SiGe recesses 1096 may be between half and twice a depth of the PMOS source/drain diffused regions 1088. Sufficient lower hard mask layer 1026 remains on the p-type doped polysilicon gate 1036 to block SiGe growth on the p-type doped polysilicon gate 1036 during a subsequent SiGe epitaxial growth process.

Referring to FIG. 1S, SiGe PMOS source/drain epitaxial regions 1098 are formed in the SiGe recesses 1096 of FIG. 1S, for example by an epitaxial growth process. An atomic fraction of germanium in the SiGe PMOS source/drain epitaxial regions 1098 may range from 20 to 35 percent. In one realization of the instant embodiment, a top surface of the SiGe PMOS source/drain epitaxial regions 1098 may extend above the gate dielectric layer 1006 between 10 and 30 nanometers. The lower hard mask layer 1026 prevents SiGe growth on the p-type doped polysilicon gate 1036. An optional post SiGe reactivation anneal may be performed after the SiGe PMOS source/drain epitaxial regions 1098 are formed to increase fractions of activated dopants in the NMOS transistor 1008 and the PMOS transistor 1010. For example, the post SiGe reactivation anneal may be a laser anneal or a spike anneal between 900 C and 1000 C.

Referring to FIG. 1T, the SiGe blocking layer 1090 of FIG. 1S and the SiGe spacers 1092 of FIG. 1S if present are removed. In one realization of the instant embodiment, the SiGe blocking layer 1090 and SiGe spacers 1092 may be removed by a wet etch which includes phosphoric acid. In another realization, the SiGe blocking layer 1090 and SiGe spacers 1092 may be removed by an isotropic plasma etch. Other processes for removing the SiGe blocking layer 1090 and the SiGe spacers 1092 are within the scope of the instant embodiment.

Referring to FIG. 1U, silicide spacers 1100 are formed on lateral surfaces of the n-type doped polysilicon gate 1034 and the p-type doped polysilicon gate 1036. The silicide spacers 1100 may be formed by depositing one or more conformal layers of spacer dielectric material on an existing top surface of the integrated circuit 1000, followed by an anisotropic plasma etch which removes spacer dielectric material from horizontal areas of the top surface, leaving the silicide spacers 1100. In one realization of the instant embodiment, the silicide spacers 1100 may be include silicon nitride. In one realization of the instant embodiment, a width of the silicide spacers 1100 may be between 10 and 40 nanometers.

Referring to FIG. 1V, NMOS source/drain silicide layers 1102 are formed at top surfaces of the NMOS source/drain diffused regions 1086. PMOS source/drain silicide layers 1104 are formed at top surfaces of the SiGe PMOS source/drain epitaxial regions 1098. An NMOS gate silicide layer 1106 may be formed at an existing top surface of the n-type doped polysilicon gate 1034. A PMOS gate silicide layer 1108 may be formed at an existing top surface of the p-type doped polysilicon gate 1036. The NMOS source/drain silicide layers 1102, the PMOS source/drain silicide layers 1104, the NMOS gate silicide layer 1106 if present, and the PMOS gate silicide layer 1108 if present may be formed by depositing a layer of metal, such as nickel, cobalt, or titanium on a top surface of the integrated circuit 1000, heating the integrated circuit 1000 to react a portion of the metal with exposed silicon in active areas of the integrated circuit 1000, and selectively removing unreacted metal from the integrated circuit 1000 surface, commonly by exposing the integrated circuit 1000 to wet etchants including a mixture of an acid and hydrogen peroxide.

While various realizations of the present embodiment have been described above, it should be understood that they have been presented by way of example only and not limitation. Numerous changes to the disclosed embodiment can be made in accordance with the disclosure herein without departing from the spirit or scope of the invention. Thus, the breadth and scope of the present invention should not be limited by any of the above described embodiment. Rather, the scope of the invention should be defined in accordance with the following claims and their equivalents.

What is claimed is:

1. A process of forming an integrated circuit, comprising:
providing a substrate;
forming a gate dielectric layer on a top surface of said substrate in an area defined for an n-channel metal oxide semiconductor (NMOS) transistor and in an area defined for a p-channel metal oxide semiconductor (PMOS) transistor;
forming a polysilicon gate layer on a top surface of said gate dielectric layer;
performing a blanket gate ion implant operation which ion implants a first set of gate dopants into said polysilicon gate layer in said NMOS transistor area and in said PMOS transistor area;
forming a gate doping photoresist pattern on a top surface of said polysilicon gate layer which exposes said top surface of said polysilicon gate layer in exactly one of said NMOS transistor area and said PMOS transistor area;
performing a patterned gate ion implant operation which ion implants a second set of gate dopants into said polysilicon gate layer in said area exposed by said gate doping photoresist pattern;
removing said gate doping photoresist pattern;
forming a lower hard mask layer on said polysilicon gate layer;
forming an upper hard mask layer on said lower hard mask layer;
performing a gate etch process on said upper hard mask layer, said lower hard mask layer and said polysilicon gate layer to form an NMOS gate structure in said NMOS transistor area and a PMOS gate structure in said PMOS transistor area, said NMOS gate structure including an n-type doped polysilicon gate, said lower hard mask layer and said upper hard mask layer, and said PMOS gate structure including a p-type doped polysilicon gate, said lower hard mask layer and said upper hard mask layer;
forming source/drain sidewall spacers on lateral surfaces of said n-type doped polysilicon gate and on lateral surfaces of said p-type doped polysilicon gate;
performing an NMOS source/drain (NSD) ion implant operation which ion implants an NSD set of dopants into said substrate in said NMOS transistor area to form NSD implanted regions in said substrate adjacent to said source/drain sidewall spacers in said NMOS transistor area;
performing a PMOS source/drain (PSD) ion implant operation which ion implants a PSD set of dopants into said substrate in said PMOS transistor area to form PSD implanted regions in said substrate adjacent to said source/drain sidewall spacers in said PMOS transistor area;
removing said source/drain sidewall spacers so that a thickness of said lower hard mask layer is not reduced;
removing any remaining said upper hard mask layer after said step of removing said source/drain sidewall spacers, so that a portion of said lower hard mask layer remains on said n-type doped polysilicon gate and said p-type doped polysilicon gate;

performing a PMOS lightly doped drain (PLDD) ion implant operation which ion implants a PLDD set of dopants into said substrate to form PLDD implanted regions in said substrate adjacent to said p-type doped polysilicon gate in said PMOS transistor area;

performing an NMOS lightly doped drain (NLDD) ion implant operation which ion implants an NLDD set of dopants into said substrate to form NLDD implanted regions in said substrate adjacent to said n-type doped polysilicon gate in said NMOS transistor area;

performing a lightly doped drain (LDD) anneal on said integrated circuit which forms NMOS source/drain diffused regions in said substrate adjacent to said n-type doped polysilicon gate in said NMOS transistor area and forms PLDD source/drain diffused regions in said substrate adjacent to said p-type doped polysilicon gate in said PMOS transistor area, after said steps of performing said NSD ion implant operation, performing said PSD ion implant operation, performing said PLDD ion implant operation and performing said NLDD ion implant operation;

forming a silicon-germanium (SiGe) blocking layer on an existing top surface of said integrated circuit in said NMOS transistor area so that said PMOS transistor area is exposed;

forming SiGe recesses in said substrate adjacent to said p-type doped polysilicon gate in said PMOS transistor area, after said step of performing said LDD anneal; and forming SiGe source/drain epitaxial regions in said SiGe recesses, so that SiGe epitaxial material is not formed on said p-type doped polysilicon gate.

2. The process of claim 1, in which said step of performing said blanket gate ion implant operation amorphizes a top region of said polysilicon gate layer.

3. The process of claim 1, in which said step of performing said patterned gate ion implant operation amorphizes a top region of said polysilicon gate layer.

4. The process of claim 1, in which said lower hard mask layer includes silicon nitride.

5. The process of claim 1, in which said upper hard mask layer includes silicon dioxide.

6. The process of claim 1, in which said upper hard mask layer includes silicon oxy-nitride.

7. The process of claim 1, further including forming SiGe spacers on lateral surfaces of said p-type doped polysilicon gate.

8. The process of claim 7, in which said SiGe spacers are formed concurrently with said SiGe blocking layer.

9. The process of claim 1, further including:
forming a stress memorization layer on an existing top surface of said integrated circuit after said steps of performing said NSD ion implant operation and performing said PSD ion implant operation;
performing a source/drain anneal operation while said stress memorization layer is present; and
removing said stress memorization layer prior to said step of forming said SiGe blocking layer.

10. The process of claim 1, further including forming LDD spacers on lateral surfaces of said n-type doped polysilicon gate and said p-type doped polysilicon gate, prior to said steps of performing said PLDD ion implant operation and performing said NLDD ion implant operation.

11. The process of claim 1, further comprising:
removing said SiGe blocking layer after said step of forming said SiGe source/drain epitaxial regions;
removing said lower hard mask layer after said step of forming said SiGe source/drain epitaxial regions;

forming silicide spacers on lateral surfaces of said n-type doped polysilicon gate and said p-type doped polysilicon gate; and forming NMOS source/drain silicide layers at top surfaces of said NMOS source/drain diffused regions and PMOS source/drain silicide layers at top surfaces of said SiGe source/drain epitaxial regions.

12. The process of claim 1, in which:
said step first set of gate dopants include p-type dopants;
said gate doping photoresist pattern exposes said NMOS transistor area; and
said second set of gate dopants includes n-type dopants.

13. The process of claim 1, in which:
said step first set of gate dopants include n-type dopants;
said gate doping photoresist pattern exposes said PMOS transistor area; and
said second set of gate dopants includes p-type dopants.

14. A process of forming an integrated circuit, comprising:
providing a substrate;
forming a gate dielectric layer on a top surface of said substrate in an area defined for an n-channel metal oxide semiconductor (NMOS) transistor and in an area defined for a p-channel metal oxide semiconductor (PMOS) transistor;
forming a polysilicon gate layer on a top surface of said gate dielectric layer;
performing a blanket gate ion implant operation which ion implants a set of p-type gate dopants into said polysilicon gate layer in said NMOS transistor area and in said PMOS transistor area, said;
forming a gate doping photoresist pattern on a top surface of said polysilicon gate layer which covers said top surface of said polysilicon gate layer in said NMOS transistor area and exposes said top surface of said polysilicon gate layer in said PMOS transistor area;
performing a patterned gate ion implant operation which ion implants a set of n-type gate dopants into said polysilicon gate layer in said NMOS transistor area;
removing said gate doping photoresist pattern;
forming a lower hard mask layer on said polysilicon gate layer, said lower hard mask layer including silicon nitride;
forming an upper hard mask layer on said lower hard mask layer, said upper hard mask layer including silicon dioxide;
performing a gate etch process on said upper hard mask layer, said lower hard mask layer and said polysilicon gate layer to form an NMOS gate structure in said NMOS transistor area and a PMOS gate structure in said PMOS transistor area, said NMOS gate structure including an n-type doped polysilicon gate, said lower hard mask layer and said upper hard mask layer, and said PMOS gate structure including a p-type doped polysilicon gate, said lower hard mask layer and said upper hard mask layer;
forming source/drain sidewall spacers on lateral surfaces of said n-type doped polysilicon gate and on lateral surfaces of said p-type doped polysilicon gate;
performing an NMOS source/drain (NSD) ion implant operation which ion implants an NSD set of dopants into said substrate in said NMOS transistor area to form NSD implanted regions in said substrate adjacent to said source/drain sidewall spacers in said NMOS transistor area;
performing a PMOS source/drain (PSD) ion implant operation which ion implants a PSD set of dopants into said substrate in said PMOS transistor area to form PSD implanted regions in said substrate adjacent to said source/drain sidewall spacers in said PMOS transistor area;

removing said source/drain sidewall spacers so that a thickness of said lower hard mask layer is not reduced;

removing any remaining said upper hard mask layer after said step of removing said source/drain sidewall spacers, so that a portion of said lower hard mask layer remains on said n-type doped polysilicon gate and said p-type doped polysilicon gate;

performing a PMOS lightly doped drain (PLDD) ion implant operation which ion implants a PLDD set of dopants into said substrate to form PLDD implanted regions in said substrate adjacent to said p-type doped polysilicon gate in said PMOS transistor area;

performing an NMOS lightly doped drain (NLDD) ion implant operation which ion implants an NLDD set of dopants into said substrate to form NLDD implanted regions in said substrate adjacent to said n-type doped polysilicon gate in said NMOS transistor area;

performing a lightly doped drain (LDD) anneal on said integrated circuit which forms NMOS source/drain diffused regions in said substrate adjacent to said n-type doped polysilicon gate in said NMOS transistor area and forms PLDD source/drain diffused regions in said substrate adjacent to said p-type doped polysilicon gate in said PMOS transistor area, after said steps of performing said NSD ion implant operation, performing said PSD ion implant operation, performing said PLDD ion implant operation and performing said NLDD ion implant operation;

forming a silicon-germanium (SiGe) blocking layer on an existing top surface of said integrated circuit in said NMOS transistor area so that said PMOS transistor area is exposed;

forming SiGe spacers on lateral surfaces of said p-type doped polysilicon gate, said SiGe spacers being formed concurrently with said SiGe blocking layer;

forming SiGe recesses in said substrate adjacent to said p-type doped polysilicon gate in said PMOS transistor area, after said step of performing said LDD anneal; and forming SiGe source/drain epitaxial regions in said SiGe recesses, so that SiGe epitaxial material is not formed on said p-type doped polysilicon gate.

15. The process of claim 14, further including:

forming a stress memorization layer on an existing top surface of said integrated circuit after said steps of performing said NSD ion implant operation and performing said PSD ion implant operation;

performing a source/drain anneal operation while said stress memorization layer is present; and removing said stress memorization layer prior to said step of forming said SiGe blocking layer.

16. The process of claim 14, in which said SiGe spacers are formed concurrently with said SiGe blocking layer.

17. The process of claim 14, further comprising:

removing said SiGe blocking layer after said step of forming said SiGe source/drain epitaxial regions;

removing said lower hard mask layer after said step of forming said SiGe source/drain epitaxial regions;

forming silicide spacers on lateral surfaces of said n-type doped polysilicon gate and said p-type doped polysilicon gate; and forming NMOS source/drain silicide layers at top surfaces of said NMOS source/drain diffused regions and PMOS source/drain silicide layers at top surfaces of said SiGe source/drain epitaxial regions.

18. A process of forming an integrated circuit, comprising:

providing a substrate;

forming a gate dielectric layer on a top surface of said substrate in an area defined for an n-channel metal oxide semiconductor (NMOS) transistor and in an area defined for a p-channel metal oxide semiconductor (PMOS) transistor;

forming a polysilicon gate layer on a top surface of said gate dielectric layer;

performing a blanket gate ion implant operation which ion implants a set of p-type gate dopants into said polysilicon gate layer in said NMOS transistor area and in said PMOS transistor area, said;

forming a gate doping photoresist pattern on a top surface of said polysilicon gate layer which covers said top surface of said polysilicon gate layer in said NMOS transistor area and exposes said top surface of said polysilicon gate layer in said PMOS transistor area;

performing a patterned gate ion implant operation which ion implants a set of n-type gate dopants into said polysilicon gate layer in said NMOS transistor area;

removing said gate doping photoresist pattern;

forming a lower hard mask layer on said polysilicon gate layer, said lower hard mask layer including silicon nitride;

forming an upper hard mask layer on said lower hard mask layer, said upper hard mask layer including silicon dioxide;

performing a gate etch process on said upper hard mask layer, said lower hard mask layer and said polysilicon gate layer to form an NMOS gate structure in said NMOS transistor area and a PMOS gate structure in said PMOS transistor area, said NMOS gate structure including an n-type doped polysilicon gate, said lower hard mask layer and said upper hard mask layer, and said PMOS gate structure including a p-type doped polysilicon gate, said lower hard mask layer and said upper hard mask layer;

forming source/drain sidewall spacers on lateral surfaces of said n-type doped polysilicon gate and on lateral surfaces of said p-type doped polysilicon gate;

performing an NMOS source/drain (NSD) ion implant operation which ion implants an NSD set of dopants into said substrate in said NMOS transistor area to form NSD implanted regions in said substrate adjacent to said source/drain sidewall spacers in said NMOS transistor area;

performing a PMOS source/drain (PSD) ion implant operation which ion implants a PSD set of dopants into said substrate in said PMOS transistor area to form PSD implanted regions in said substrate adjacent to said source/drain sidewall spacers in said PMOS transistor area;

forming a stress memorization layer on an existing top surface of said integrated circuit after said steps of performing said NSD ion implant operation and performing said PSD ion implant operation;

performing a source/drain anneal operation while said stress memorization layer is present;

removing said stress memorization layer;

removing said source/drain sidewall spacers so that a thickness of said lower hard mask layer is not reduced;

removing any remaining said upper hard mask layer after said step of removing said source/drain sidewall spacers, so that a portion of said lower hard mask layer remains on said n-type doped polysilicon gate and said p-type doped polysilicon gate;

performing a PMOS lightly doped drain (PLDD) ion implant operation which ion implants a PLDD set of dopants into said substrate to form PLDD implanted regions in said substrate adjacent to said p-type doped polysilicon gate in said PMOS transistor area;

performing an NMOS lightly doped drain (NLDD) ion implant operation which ion implants an NLDD set of dopants into said substrate to form NLDD implanted regions in said substrate adjacent to said n-type doped polysilicon gate in said NMOS transistor area;

performing a lightly doped drain (LDD) anneal on said integrated circuit which forms NMOS source/drain diffused regions in said substrate adjacent to said n-type doped polysilicon gate in said NMOS transistor area and forms PLDD source/drain diffused regions in said substrate adjacent to said p-type doped polysilicon gate in said PMOS transistor area, after said steps of performing said NSD ion implant operation, performing said PSD ion implant operation, performing said PLDD ion implant operation and performing said NLDD ion implant operation;

forming a silicon-germanium (SiGe) blocking layer on an existing top surface of said integrated circuit in said NMOS transistor area so that said PMOS transistor area is exposed;

forming SiGe spacers on lateral surfaces of said p-type doped polysilicon gate, said SiGe spacers being formed concurrently with said SiGe blocking layer;

forming SiGe recesses in said substrate adjacent to said p-type doped polysilicon gate in said PMOS transistor area, after said step of performing said LDD anneal; and forming SiGe source/drain epitaxial regions in said SiGe recesses, so that SiGe epitaxial material is not formed on said p-type doped polysilicon gate.

19. The process of claim 18, further comprising:

removing said SiGe blocking layer after said step of forming said SiGe source/drain epitaxial regions;

removing said lower hard mask layer after said step of forming said SiGe source/drain epitaxial regions;

forming silicide spacers on lateral surfaces of said n-type doped polysilicon gate and said p-type doped polysilicon gate; and forming NMOS source/drain silicide layers at top surfaces of said NMOS source/drain diffused regions and PMOS source/drain silicide layers at top surfaces of said SiGe source/drain epitaxial regions.

* * * * *